United States Patent
Shinagawa et al.

(10) Patent No.: US 8,130,571 B2
(45) Date of Patent: *Mar. 6, 2012

(54) SEMICONDUCTOR INTEGRATED CIRCUIT

(75) Inventors: Yutaka Shinagawa, Tokyo (JP); Takeshi Kataoka, Tokyo (JP); Eiichi Ishikawa, Tokyo (JP); Toshihiro Tanaka, Tokyo (JP); Kazumasa Yanagisawa, Tokyo (JP); Kazufumi Suzukawa, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/162,180

(22) Filed: Jun. 16, 2011

(65) Prior Publication Data

US 2011/0246860 A1    Oct. 6, 2011

Related U.S. Application Data

(60) Continuation of application No. 12/775,377, filed on May 6, 2010, now Pat. No. 7,978,545, which is a continuation of application No. 12/258,964, filed on Oct. 27, 2008, now Pat. No. 7,821,824, which is a division of application No. 11/573,004, filed as application No. PCT/JP2004/012489 on Aug. 30, 2004, now abandoned.

(51) Int. Cl.
*G11C 7/00* (2006.01)

(52) U.S. Cl. ......... 365/189.19; 365/185.01; 365/185.24; 365/185.22; 365/185.11; 365/189.18

(58) Field of Classification Search ............. 365/185.01, 365/185.24, 185.22, 185.11, 189.18, 189.19
See application file for complete search history.

(56) References Cited

U.S. PATENT DOCUMENTS 4,835,742 A    5/1989   Schrenk
5,835,936 A    11/1998  Tomioka et al.
(Continued)

FOREIGN PATENT DOCUMENTS

CN    1387128 A    12/2002
(Continued)

OTHER PUBLICATIONS

Yukio Fujisawa, "SH-2 Series no Tokucho, Super H Processor", $2^{nd}$ edition, CQ Publishing Co., Ltd., Aug. 1, 2000, pp. 90-95.

*Primary Examiner* — Fernando Hidalgo
(74) *Attorney, Agent, or Firm* — Miles & Stockbridge P.C.

(57) ABSTRACT

A semiconductor integrated circuit has a central processing unit and a rewritable nonvolatile memory area disposed In an address space of the central processing unit. The nonvolatile memory area has a first nonvolatile memory area and a second nonvolatile memory area, which memorize information depending on the difference of threshold voltages. The first nonvolatile memory area has the maximum variation width of a threshold voltage for memorizing information set larger than that of the second nonvolatile memory area. When the maximum variation width of the threshold voltage for memorizing information is larger, since stress to a memory cell owing to a rewrite operation of memory information becomes larger, it is inferior In a point of guaranteeing the number of times of rewrite operation; however, since a read current becomes larger, a read speed of memory information can be expedited. The first nonvolatile memory area can be prioritized to expedite a read speed of the memory information and the second nonvolatile memory area can be prioritized to guarantee the number of times of rewrite operation of memory information more.

12 Claims, 13 Drawing Sheets

| U.S. PATENT DOCUMENTS | | | |
|---|---|---|---|
| 6,285,597 B2 | 9/2001 | Kawahara et al. | |
| 6,570,595 B2 * | 5/2003 | Porter | 715/802 |
| 6,662,314 B1 | 12/2003 | Iwata et al. | |
| 6,871,269 B2 | 3/2005 | Rosay et al. | |
| 7,286,410 B2 | 10/2007 | Tanikawa et al. | |
| 7,881,585 B2 * | 2/2011 | Reese et al. | 386/200 |
| 2002/0059569 A1 | 5/2002 | Kondo | |
| 2002/0116570 A1 | 8/2002 | Miyamoto | |
| 2003/0164971 A1 | 9/2003 | Kidani et al. | |
| 2011/0010221 A1 * | 1/2011 | Horn | 705/9 |

| FOREIGN PATENT DOCUMENTS | | |
|---|---|---|
| JP | 58-150191 A | 9/1983 |
| JP | 04-023354 A | 1/1992 |
| JP | 09-022393 A | 1/1997 |
| JP | 2001-044394 A | 2/2001 |
| JP | 2001-142740 A | 5/2001 |
| JP | 2001-306543 A | 11/2001 |
| JP | 2002-245023 A | 8/2002 |
| JP | 2004-134047 A | 4/2004 |
| WO | WO 99/65083 A1 | 12/1999 |

* cited by examiner

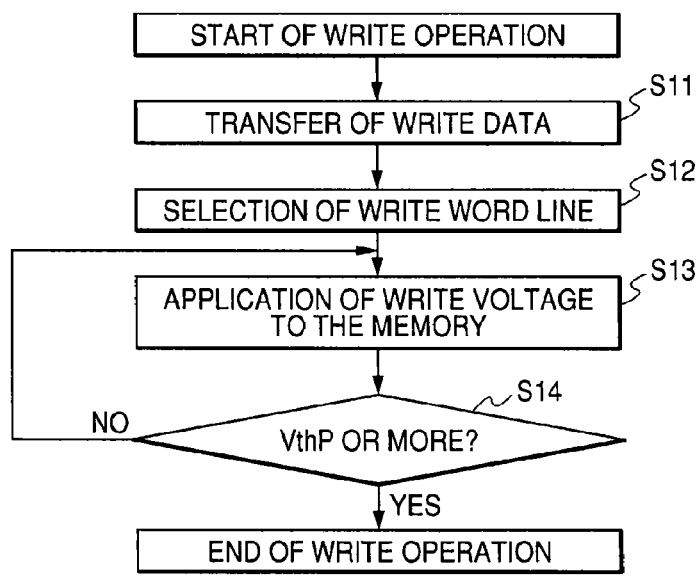

| | RELATIVE VALUE OF PROGRAM AREA AND DATA AREA | PROGRAM AREA | DATA AREA |
|---|---|---|---|
| GUARANTEED NUMBER OF TIMES OF P/E | PROGRAM AREA ≤ DATA AREA | SMALL (1000 TIMES) | MANY (100,000 TIMES) |
| REED SPEED | PROGRAM AREA ≥ DATA AREA | RAPID (1000MHz) <CPU BUS CYCLES> | SLOW (25MHz) <PERIPHERAL BUS CYCLES> |
| ERASE UNIT (ERASE BLOCK VOLUME) | PROGRAM AREA ≥ DATA AREA | LARGE (4kB) | SMALL (1kB) |
| WRITE UNIT (SIZE OF SIMULTANEOUS WRITE OPERATION) | PROGRAM AREA ≥ DATA AREA | LARGE (128B) | SMALL (8B) |
| MAIN STORAGE DATA | — | CPU PROGRAM | FREQUENTLY REWRITTEN DATA |

FIG. 9

| | | |
|---|---|---|
| (a) CELL STRUCTURE | | |

| (b) OPERATIONAL VOLTAGE (V) | | Vd | Vcg | Vmg | Vs | Vsub |
|---|---|---|---|---|---|---|
| | Read | 1.8 | 1.8 | 0 | 0 | 0 |
| | Erase | 0 | 1.8 | 12 | 0 | 0 |
| | Program | 0 | 1.8 | 8 | 6 | 0 |

(c) HIERARCHAL BIT LINE CONFIGURATION

⊣⊢ HIGH VOLTAGE MOS

▷∘ HIGH VOLTAGE MOS DRIVER

SEMICONDUCTOR INTEGRATED CIRCUIT

CROSS-REFERENCE TO RELATED APPLICATION

This application is a continuation of application Ser. No. 12/775,377 filed May 6, 2010 now U.S. Pat. No. 7,978,545, which is a continuation of application Ser. No. 12/258,964 filed Oct. 27, 2008 (now U.S. Pat. No. 7,821,824 issued Oct. 26, 2010), which is a division of application Ser. No. 11/573,004 filed Jan. 31, 2007 (abandoned), which is a 371 of International Application No. PCT/JP2004/012489 filed Aug. 30, 2004.

TECHNICAL FIELD

The present invention relates to a semiconductor integrated circuit having a rewritable non-volatile memory area that memorizes information depending on differences of threshold voltages, and particularly to a technology that pays attention to relationship between the guaranteed number of times when memory information is rewritten and a read speed of the memory information such as a technology that is effectively applicable to a microcomputer where a rewritable nonvolatile memory is mounted on a chip together with a central processing unit.

BACKGROUND ART

In patent document 1, there is disclosed a technology where, when data such as a user program and the like are written in a user memory area of a flash memory, a flash firmware and a parameter of a default and flash identification information are stored in advance in a mask memory area of a mask ROM, version information or lot information is stored in a non-volatile memory and a CPU selects and carries out an optimum flash firmware and a parameter based on the version information, a rewrite process to the flash memory can be carried out under the optimum condition.

In patent document 2, there is disclosed a technology that has an EEPROM for data and an EEPROM for program, stores a locking code in a designated area, and, by making use of the locking code, inhibits price data or programs stored in a rewritable memory such as the EEPROM for data and the EEPROM for program from being altered.

Patent Document 1: JP-A-2001-306543
Patent Document 2: JP-A-2002-245023

DISCLOSURE OF THE INVENTION

Problems that the Invention is to Solve

The present inventors studied, in a rewritable non-volatile memory typical in a flash memory, the relationship between the guaranteed numbers of times when memory information is rewritten and read speed of the memory information. For instance, for a flash memory on-chipped on a microcomputer and the like, normally, the read speed and the guaranteed number of times of rewrite operation are set same irrespective of memory areas. The inventors paid attention to inconveniences caused by this.

In order to expedite a read operation, a memory current has to be increased, and, for this, a threshold voltage to a read determination level of a memory cell has to be largely lowered. This means to expand a threshold voltage difference ($Vth_{window}$) between a threshold voltage in a write state and a threshold voltage in an erase state. When the threshold voltage difference is made larger, a memory cell receives larger stress accordingly, and thereby the characteristics are deteriorated faster. As a result, the lifetime of rewrite cycle becomes shorter, resulting in difficulty in guaranteeing the number of times of rewrite operation such as 100,000 times. On the other hand, when the threshold voltage difference ($Vth_{window}$) is lowered to alleviate the rewrite stress, a threshold voltage cannot be so much lowered to a read determination level of a memory cell. That is, since a deep erase operation cannot be applied, a memory current cannot be set larger. When the memory current is small, a high-speed read operation such as 100 MHz becomes difficult. In a flash memory incorporated in a microcomputer, in an application that stores a program, a read speed same as an executing speed of the program is required; accordingly, the high-speed read is prioritized and the number of times of rewriting memory information cannot be guaranteed so much. Such an on-chip flash memory cannot be applied to a data application where the number of times of rewrite operation such as around 100,000 times is necessary; accordingly, an externally-mounted EEPROM or an externally-mounted flash memory of a microcomputer has to be used to overcome this problem.

In the technologies described in patent literatures as well, a nonvolatile memory or a nonvolatile memory area is divided depending on applications. However, from viewpoints of higher read speeds corresponding to applications and guaranteeing the number of times of rewrite operation, an attention is not paid to dividing a nonvolatile memory area. The inventors found necessity of satisfying, in one semiconductor integrated circuit, to a nonvolatile memory, both of expediting read speeds corresponding to applications and guaranteeing many of the number of times of rewrite operation.

An object of the invention is to provide a semiconductor integrated circuit that can satisfy, to a nonvolatile memory, both of expediting read speeds corresponding to applications and guaranteeing many of the number of times of rewrite operation.

The above-mentioned and other objects and noble features of the invention will be clarified with reference to the description of the specification and attached drawings.

Means for Solving the Problems

Outlines of typical ones of inventions disclosed in the present patent application will be briefly described below.

[1] A semiconductor integrated circuit includes a central processing unit and a rewritable nonvolatile memory area disposed in an address space of the central processing unit. The nonvolatile memory area has a first nonvolatile memory area (PGM) and a second nonvolatile memory area (DAT), which memorize information depending on the difference of threshold voltages. The first nonvolatile memory area has the maximum variation width of a threshold voltage for memorizing information set larger than that of the second nonvolatile memory area. The maximum variation width of a threshold voltage for memorizing information means the maximum difference between an initializing level of a threshold voltage (a threshold voltage level due to an erase operation) corresponding to a logical value of one data of memory information and a threshold voltage level (a threshold voltage level due to a write operation) corresponding to a logical value of other data. The "maximum" means to consider not only a case where memory information to one memory cell is 1 bit but also a case where the memory information is two or more bits.

When the maximum variation width of a threshold voltage for memorizing information is large, the stress to a memory cell due to a rewrite operation of memory information becomes larger. Accordingly, the guaranteed number of times of rewrite operation is disadvantageously deteriorated; however, since a read current becomes larger, the read speed of memory information can be expedited. This is because the conductance of a nonvolatile memory cell that is turned on can be readily made larger. Accordingly, in the first nonvolatile memory area, the expedition of the read speed of memory information can be prioritized, and, in the second nonvolatile memory area, guaranteeing many of the number of times of rewrite operation can be prioritized.

In order to make the maximum variation width of the threshold voltage larger, in the first nonvolatile memory area, a distribution of initializing levels of the threshold voltage has only to be made lower than that of the second nonvolatile memory area. Alternatively, in the first nonvolatile memory area, a distribution of threshold voltage levels such as the threshold voltage levels due to the write operation has only to be made higher than that of the second nonvolatile memory area. In the former case, a read determination level such as a selection level of a read word line may be the same in both of the first nonvolatile memory area and second nonvolatile memory area. In the latter case, the read determination level has to be higher in the first nonvolatile memory area than that of the second nonvolatile memory area.

That is, in the case of a read word line selection level being applied to a memory cell in each of the memory areas being taken as a reference, when a voltage difference up to a distribution of initializing levels of the threshold voltage in the first nonvolatile memory area is made larger than a voltage difference up to a distribution of initializing levels of the threshold voltage in the second nonvolatile memory area, the first nonvolatile memory area can be made larger in a read current of a memory cell.

From the above, it goes without saying that the first nonvolatile memory area can be expedited in the read speed of memory information more than the second nonvolatile memory area.

As a specific mode, a first nonvolatile memory (11, 11A) provided with the first nonvolatile memory area and a second nonvolatile memory (12, 12A) provided with the second nonvolatile memory area may be separately disposed. Alternatively, one nonvolatile memory (11B) provided with both of the first nonvolatile memory area and second nonvolatile memory area may be disposed.

As one desirable mode, the first nonvolatile memory area is used to store programs and the second nonvolatile memory area is used to store data. In an application where a program is stored, a read speed same as an executing speed of the program is necessary; accordingly, a high-speed read operation is prioritized. Normally, a program is not so frequently rewritten in comparison with data; accordingly, there is no problem even when the guaranteed number of times of rewrite operation may be small. The data are assumed frequently rewritten; accordingly, the data area is necessarily guaranteed to be large in the number of times of rewrite operation. A data area assumed here is not a volatile memory such as a work RAM of a central processing unit but an area where initializing parameters are stored. Since the data area is not a memory area where a high-speed access is necessary like the work RAM, there is no substantial disadvantage even when the read speed is slow.

[2] A semiconductor integrated circuit according to another aspect has a two-bus configuration having a first bus and a second bus to the semiconductor integrated circuit, in a specific configuration a nonvolatile memory being connected to each of the buses. That is, a semiconductor integrated circuit includes a central processing unit (2), a volatile memory (3), a first bus (4) thereto the central processing unit and the volatile memory are connected, a bus controller (5) connected to the first bus and a second bus (6) connected to the bus controller. To the first bus, a first nonvolatile memory (11, 11A) that memorizes information depending on difference of threshold voltages and can be electrically rewritten is connected. To the second bus, a second nonvolatile memory (12, 12A) that memorizes information depending on difference of threshold voltages and can be electrically rewritten is connected. The first nonvolatile memory is set larger in the maximum variation width of a threshold voltage for memorizing information than the second nonvolatile memory. In the invention as well, similarly to the above, the first nonvolatile memory can be prioritized in expediting a read speed of memory information and the second nonvolatile memory can be prioritized in guaranteeing the number of times of rewrite operation more.

As one specific mode, when a distribution of initializing levels of the threshold voltage is made lower in the first nonvolatile memory than in the second nonvolatile memory, the maximum variation width of the threshold voltage can be made larger.

As one desirable mode, the first nonvolatile memory is used to store a program that the central processing unit executes and the second nonvolatile memory is used to store data that are used when the central processing unit executes a program.

As one specific mode, the first nonvolatile memory includes a first access port (50) that is used in a read access operation to the first bus and a second access port (51) that is used in an access operation for rewriting memory information from the second bus, the central processing unit applying access control for rewriting memory information to a first memory. The access port is divided in two parts, one being used for reading memory information and the other one being used for rewriting. Thereby, the read port can be readily optimized for expediting a read operation. For instance, in the read port, an input buffer that receives rewrite data is unnecessary. The input buffer accompanies input capacitance that becomes a load to a data output signal line. Furthermore, even when, between the first access port and the first bus, an ECC circuit (13) that can detect and correct an error to data read from the first access port is disposed, there is no need of considering a verify operation in a rewrite operation. In the verify operation, from the nature thereof, the error correction can be inconveniently applied to read data. When a read operation and a rewrite operation of memory information are carried out in one access port, in the rewrite operation, a signal path that detours the ECC circuit becomes necessary, such an additional path forming an undesirable load to the read operation of the memory information.

As a further specific mode, when considering that the central processing unit connected to the first bus controls, from the second access port through the second bus, a rewrite operation of memory information, an address space to the first nonvolatile memory seen from the first access port is desirably differentiated from an address space to the first nonvolatile memory seen from the second access port.

A rewrite control operation of memory information to the nonvolatile memory is carried out, for instance, when the central processing unit executes a rewrite control program. The rewrite control program is included in, for instance, the first nonvolatile memory. The central processing unit executes a rewrite control program internally transferred from the first nonvolatile memory to the volatile memory. An instruction of a rewrite operation of memory information is given through a program that the central processing unit executes. Alternatively, a write unit such as an external EPROM writer gives a rewrite command to instruct. The central processing unit, when a rewrite command is externally inputted, deciphers this to execute, according to a deciphered result, a rewrite control program that the first nonvolatile memory has, and thereby the memory information that the first nonvolatile memory holds can be subjected to a rewrite control operation.

As a still further specific mode, a nonvolatile memory cell that the first nonvolatile memory has includes a memory transistor of which a threshold voltage is differentiated depending on a charge retention state of a charge storage area and a select transistor that can selectively connect the memory transistor to a bit line. A gate insulating film of the select transistor is formed thinner than that of the memory transistor. When hot electrons generated owing to a voltage difference between a channel formed in a semiconductor area immediately below a gate electrode of the select transistor and a channel formed in a semiconductor area immediately below a charge storage area of the memory transistor are injected in the charge storage area to heighten a threshold voltage value and thereby electrons that the charge storage area holds are reduced, a threshold voltage is initialized toward a lower direction. When hot electrons are injected in the charge storage area, since a source side of a channel of a memory transistor to which a high voltage is supplied from a drain side and a drain side of a channel of the select transistor do not enter a conductive state of electrically low resistance, a high voltage on a memory transistor side is not applied to the select transistor. Accordingly, even when a gate insulating film of the select transistor is formed thinner than a gate insulating film of the memory transistor, a gate oxide film of the select transistor is not destroyed during a rewrite operation. This insures to make the conductance of the select transistor larger owing to a thin gate insulating film to expedite a read speed.

[3] A semiconductor integrated circuit according to still another aspect has, to the semiconductor integrated circuit, a two-bus configuration having a first bus and a second bus, a specific configuration where a first nonvolatile memory area (PGM) and a second nonvolatile memory area (DAT) are assigned to a nonvolatile memory (11B) connected to the first bus being clearly specified. That is, a semiconductor integrated circuit includes a central processing unit, a volatile memory, a first bus to which the central processing unit and the volatile memory are connected, a bus controller connected to the first bus and a second bus connected to the bus controller, a nonvolatile memory being connected to the first bus. The nonvolatile memory has a first nonvolatile memory area and a second nonvolatile memory area that stores information depending on the difference of the threshold voltage, the first nonvolatile memory area being set larger in the maximum variation width of the threshold voltage for memorizing information in comparison with the second nonvolatile memory area. In the invention as well, similarly to the above, the first nonvolatile memory area can be prioritized in expediting a read speed of memory information and the second nonvolatile memory area can be prioritized in guaranteeing the number of times of rewrite operation more.

As one specific mode, when a distribution of initializing levels of the threshold voltage is made lower in the first nonvolatile memory area than in the second nonvolatile memory, the maximum variation width of the threshold voltage can be made larger.

As one specific mode, a read determination level that is given to the nonvolatile memory cell when, in the first nonvolatile memory area, memory information corresponding to a threshold voltage is read from a nonvolatile memory cell is same as the read determination level given to the nonvolatile memory cell when, in the second nonvolatile memory area, memory information corresponding to a threshold voltage is read from the nonvolatile memory cell.

As one desirable mode, the first nonvolatile memory area is used to store a program that the central processing unit executes and the second nonvolatile memory area is used to store data that are used when the central processing unit executes a program.

As a further specific mode, in each of the first nonvolatile memory area and the second nonvolatile memory area, a hierarchal bit line structure made of a plurality of segmented areas (61), a plurality of first bit lines (LBL) intrinsic to the respective segmented areas, a second bit line (GBLr) common to the plurality of segmented regions, a select circuit (62) that selects the first bit line from the segmented area and a sense amplifier disposed between an output of the select circuit and the second bit line is adopted, a load of each of the first bit lines being made smaller in the second nonvolatile memory area than in the first nonvolatile memory area. Thereby, when a first nonvolatile memory area and a second nonvolatile memory area different in the characteristics are constituted in one nonvolatile memory, a delay in a read speed from the second memory area of which a maximum variation width of the threshold voltage for memorizing information is set relatively smaller can be improved; accordingly, the access time through the first bus can be set same to the first nonvolatile memory area and the second nonvolatile memory area. As a still another mode, the central processing unit, in a read access control to the nonvolatile memory, can control so that the number of access cycles to the second nonvolatile memory area may be larger than the number of access cycles to the first nonvolatile memory area to cope with the difference of the read speeds.

As a further specific mode, the nonvolatile memory includes a first access port that is used in a read access operation to the first bus and a second access port that is used in an access operation for rewriting memory information from the second bus, the central processing unit controlling an access operation for rewriting memory information to the nonvolatile memory. The access port is divided in two parts, one being used for reading memory information and the other one being used for rewriting. Thereby, the read port can be readily optimized for expediting a read operation. For instance, in the read port, an input buffer that receives rewrite data is unnecessary. The input buffer accompanies input capacitance that becomes a load to a data output signal line. Furthermore, even when, between the first access port and the first bus, an ECC circuit that can detect and correct an error to data read from the first access port is disposed, there is no need of considering a verify operation in a rewrite operation. In the verify operation, from the nature thereof, the error correction can be inconveniently applied to read data. When a read operation and a rewrite operation of memory information are carried out in one access port, in the rewrite operation, a signal path that detours the ECC circuit becomes necessarily added, such an additional path forming an undesirable load to the read operation of the memory information.

As a further specific mode, when considering that the central processing unit connected to the first bus controls, from the second access port through the second bus, a rewrite operation of memory information, an address space to the nonvolatile memory seen from the first access port is desirably differentiated from an address space to the nonvolatile memory seen from the second access port.

A rewrite control operation of memory information to a nonvolatile memory is carried out, for instance, when the central processing unit executes a rewrite control program. The rewrite control program is included in, for instance, the first nonvolatile memory. The central processing unit executes a rewrite control program internally transferred from the first nonvolatile memory to the volatile memory. An instruction of a rewrite operation of memory information is given through a program that the central processing unit executes. Alternatively, a write unit such as an external EPROM writer gives a rewrite command to instruct. The central processing unit, when a rewrite command is externally inputted in the external interface circuit, deciphers this to execute, according to a deciphered result, a rewrite control program that the first nonvolatile memory has, and thereby the memory information that the first nonvolatile memory holds can be subjected to a rewrite control operation.

As a still further specific mode, a nonvolatile memory cell that the nonvolatile memory has includes a memory transistor of which threshold voltage is differentiated depending on a charge retention state of a charge storage area and a select transistor that can selectively connect the memory transistor to a bit line. A gate insulating film of the select transistor is formed thinner than that of the memory transistor. When hot electrons generated owing to a voltage difference between a channel formed in a semiconductor area immediately below a gate electrode of the select transistor and a channel formed in a semiconductor area immediately below a charge storage area of the memory transistor are injected in the charge storage area to heighten a threshold voltage value and thereby electrons that the charge storage area holds are reduced, a threshold voltage is initialized toward a lower direction. The select transistor can have large conductance owing to a thin gate oxide film and thereby a read speed can be improved.

[4] A semiconductor integrated circuit according to still another aspect includes a central processing unit and a rewritable nonvolatile memory area disposed in an address space of the central processing unit, the nonvolatile memory area having a first nonvolatile memory area and a second nonvolatile memory area that stores information depending on the difference in a current amount that flows a memory cell. Each of a memory cell in the first nonvolatile memory area and a memory cell in the second nonvolatile memory area has a first state (for instance, write state) and a second state (for instance, erase state). A first state of the memory cell in the first memory area and a first state of the memory cell in the second memory area are controlled so that current amounts that flow the memory cells may be contained in a first range, in a second state of the memory cell in the first memory area, a current amount that flows the memory cell is controlled so as to be contained in a second range, and in a second state of the memory cell in the second memory area, a current amount that flows the memory cell is controlled so as to be contained in a third range different from the second range. As a specific mode of the invention, the second range and the third range partially overlap. A further specific mode of the invention has a detection circuit that detects in which range of the first through third ranges a current that flows the memory cell is contained. The detection circuit is for instance a sense amplifier, and, depending on a current amount on a sense side, in which range of the first through third ranges the current amount is contained can be detected.

Advantage of the Invention

Advantages obtained from typical ones of the inventions disclosed in the patent application are briefly described as follows. That is, to a nonvolatile memory on-chipped on a semiconductor integrated circuit, expediting a read speed and guaranteeing the number of times of rewrite operation more can be simultaneously satisfied.

BRIEF DESCRIPTION OF THE DRAWINGS

FIG. 5 is a flow chart showing a write procedure to a flash memory.

FIG. 6 is an explanatory diagram showing a specification of a flash memory when a nonvolatile memory area is segmented into a program area PGM and a data area DAT.

FIG. 9 is an explanatory diagram typically showing connection states of a nonvolatile memory cell of FIG. 8 in a hierarchal bit line structure and features thereof.

Figure 1:
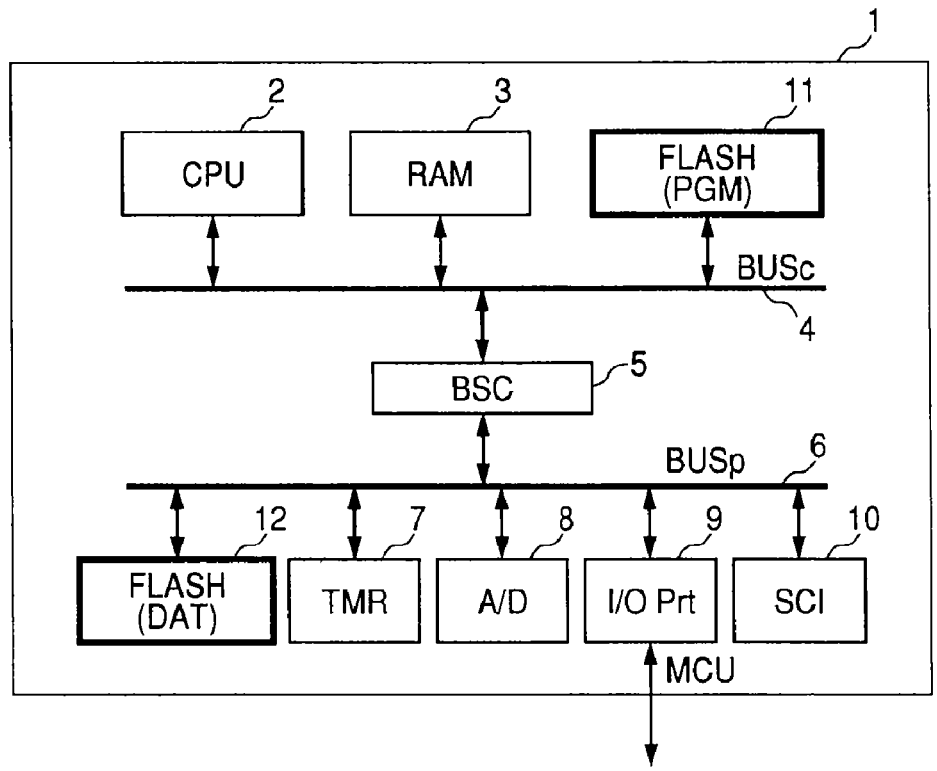
FIG. 1 is a block diagram showing a first example of a data processor.

DESCRIPTION OF REFERENCE NUMERALS AND SIGNS 1, 1A, 1B, 1C: data processor
2: CPU (central processing unit)
3: RAM
4: CPU Bus
5: bus controller
6: peripheral bus
9: INPUT/OUTPUT port
11, 11A: flash memory with a program area
11B: flash memory with a program area and a data area
13: ECC circuit
PGM: program area
12, 12A: flash memory with a data area
DAT: data area
VthP: read determination level common to a data area and a program area
VthEP: erase determination level of a program area VthEd: erase determination level of a data area
21: split-gate type nonvolatile memory cell
23: memory transistor
24: select transistor
31: charge storage area
34: memory gate electrode
38: control gate electrode
50: first access port
51: second access port
52: stacked gate type nonvolatile memory cell
60: memory mat
61: memory array
61A: memory array for a program area
61B: memory array for a data area
LBL: local bit line
SA: sense amplifier
GBLr: read global bit line
GBLw: write global bit line

BEST MODE FOR CARRYING OUT THE INVENTION

FIG. 1 shows a first example of a data processor. The data processor (MCU) 1 is formed on one semiconductor substrate such as a silicon single crystal by use of a CMOS integrated circuit producing technology. The data processor 1 includes: a central processing unit (CPU) 2; a random access memory (RAM) 3 as a volatile memory, which is used as a work area of the CPU 2; a CPU bus (BUSc) 4 as a first bus, to which the CPU 2 and the RAM 3 are connected; a bus controller (BSC) 5 connected to the CPU bus 4; and a peripheral bus (BUSp) 6 as a second bus, which is connected to the bus controller 5, and has a hierarchal bus configuration. To the peripheral bus 6, peripheral circuits such as a timer (TMR) 7, an analog/digital converter (A/D) 8, an input/output port (I/O prt) 9 and a serial interface controller (SCI) 10 are connected. To the CPU bus 4, as an electrically rewritable first nonvolatile memory that stores information depending on the difference of threshold voltage, a flash memory 11 is connected. To the peripheral bus 6, as an electrically rewritable second nonvolatile memory that stores information depending on the difference of threshold voltage, a flash memory 12 is connected. The flash memory 11 has, as a first nonvolatile memory area, a storage area (program area PGM) of a program that the CPU 2 executes. The flash memory 12 has, as a second nonvolatile memory area, a storage area (data area DAT) of data that are used when the CPU 2 executes a program.

Figure 7:
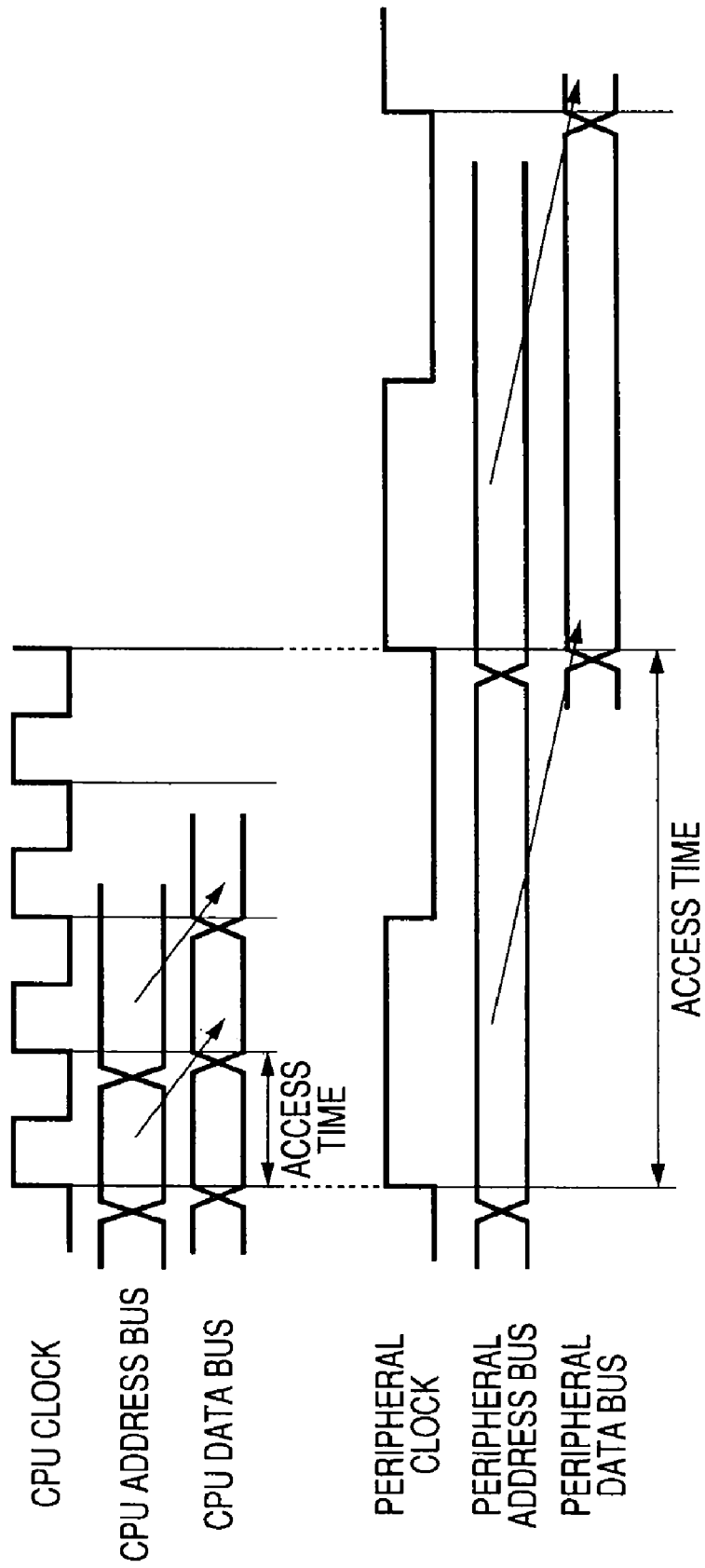
FIG. 7 is a timing chart exemplifying the access timing in a hierarchal bus configuration.

In the hierarchal bus structure, the CPU bus 4, from the nature in that circuit modules such as the CPU 2 and the RAM 3 that determine the data processing capability are connected, is formed into a high-speed bus in which wiring load is limited, and thereby a high-speed data transfer is intended. Many peripheral circuit modules such as the timer 7 and the A/D 8 that are connected to the peripheral bus 6 are operated after parameters are set from the CPU 2 and an external memory such as an EPROM that temporarily stores data is connected through the I/O port 9 connected to the peripheral bus 6. Accordingly, the peripheral bus 6 may be a relatively low-speed bus. In FIG. 7, access timings in the hierarchal bus configuration are exemplified. A synchronous clock (peripheral clock) of the peripheral circuit module is stepped up to one fourth to an operation reference clock (CPU clock) of the CPU 2 and thereby the peripheral modules connected to the peripheral bus are accessed at a lower speed than the RAM 3 or the like connected to the CPU 2. Read data are determined on a data bus at a cycle next to an address determination cycle on an address bus.

In the bus hierarchal structure, the flash memory 11 having the program area PGM is connected to the CPU bus 4 and necessarily capable of reading at an execution speed of the CPU 2. On the other hand, the flash memory 12 having the data area DAT is connected to the peripheral bus 6 and may be able to read at a relatively low speed same as other peripheral modules. However, the data area DAT is assumed being rewritten more frequently than the program area PGM. The data area DAT that is frequently rewritten is used to store data such as parameter information that has no direct relation with the program execution; accordingly, necessity of reading memory information at a high-speed therefrom is low.

In the data processor 1, the above-mentioned situations are taken into consideration. That is, an on-chip nonvolatile memory area is segmented into a program area PGM that can be read at a high-speed and a data area DAT that allows rewriting many times.

Figure 2:
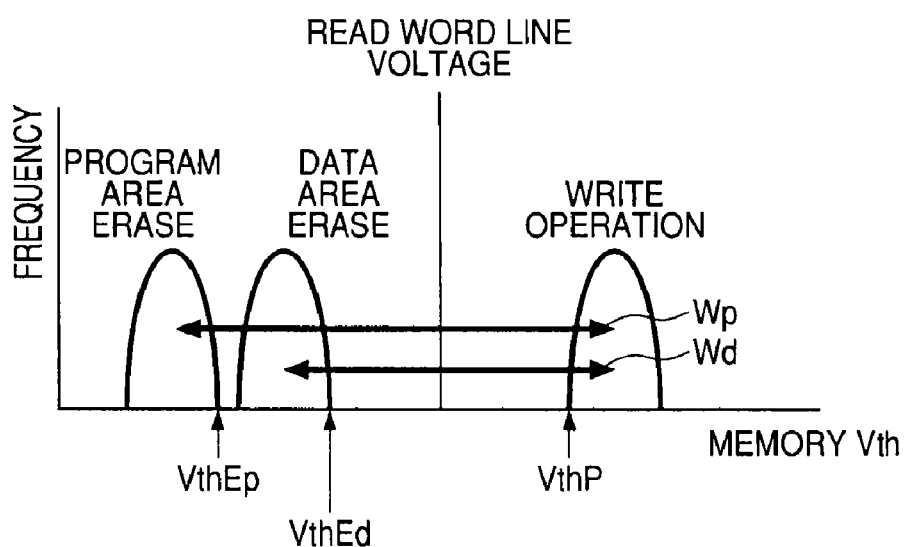
FIG. 2 is a characteristic diagram exemplifying threshold voltage distributions of a nonvolatile memory cell in a data area and a program area.

In FIG. 2, threshold voltage distributions of nonvolatile memory cells in a data area and a program area are exemplified. In the program area PGM, in order to secure a sufficient memory current necessary for a high-speed read operation, a memory threshold voltage of an erase state is set sufficiently low. In the example, the determination level of an erase verify operation (erase determination level) at that time is set at VthEp. On the other hand, in the data area DAT, in order to increase the guaranteed number of times of rewrite operation, an erase operation is stopped at such a small memory current as can be read at a low speed, a memory threshold voltage in an erase state is set higher than that in the case of the program area, the stress applied on the nonvolatile memory cell upon rewriting is alleviated, and thereby the characteristics are inhibited from deteriorating. In the example, the determination level in an erase verify operation (erase determination level) in the data area DAT is set at VthEd. In FIG. 2, the determination level in a write verify operation (write determination level) is set at VthP same for both the program area PGM and the data area DAT. Though not particularly shown in the drawing, in the write operation as well, in order to reduce the write stress, the write determination level may be differed between the program area PGM and the data area DAT. In order to obtain performances required respectively for the program area PGM and the data area DAT to a flash memory on-chipped on one data processor 1 like this, the difference is imparted to the threshold voltages of the nonvolatile memory cells. In essence, in the program area PGM, in comparison with the data area DAT, the maximum variation width for storing information is set larger. In FIG. 2, Wp denotes the maximum variation width of the program area and Wd is the maximum variation width of the data area. The maximum variation width can be grasped as the difference between the erase determination level and the write determination level. In essence, $VthP-VthEp>VthP-VthEd$ is satisfied. Each of the threshold voltage distributions exemplified in FIG. 2 is considered a normal distribution.

However, in FIG. 2, the threshold voltage distribution in an erase state of the program area and the threshold voltage distribution in an erase state of the data area are not inhibited from partially overlapping each other.

Figure 3:
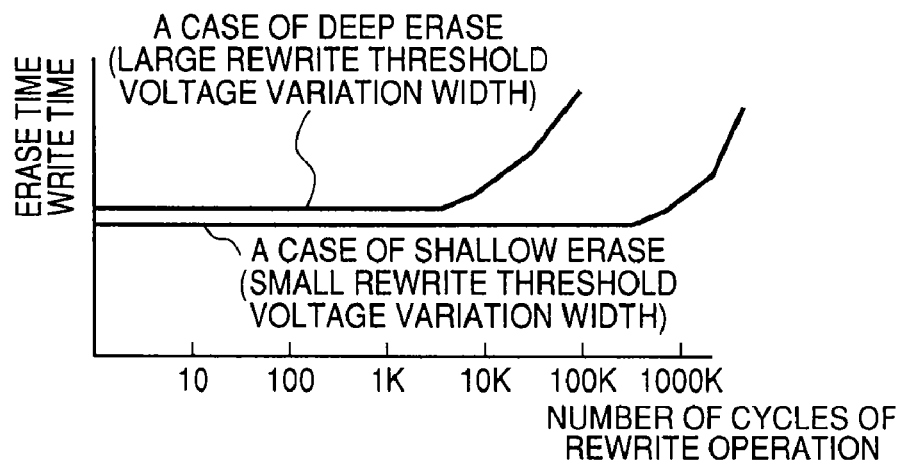
FIG. 3 is an explanatory diagram exemplifying relationship between rewrite time and the number of rewrite cycles.

FIG. 3 exemplifies relationship between rewrite time and number of cycles of rewrite operation. In the flash memory, every time when the rewrite operation is repeated, the characteristics are deteriorated. For instance, an erase time or a write time necessary for obtaining a predetermined threshold voltage increases. Since the occurrence of the deterioration depends on for instance a depth of the erase threshold voltage (difference between a threshold voltage of a write state and a threshold voltage of an erase state), when the erase operation is stopped at a shallow level to inhibit the characteristics from deteriorating, the number of times of rewrite operation can be extended. From the above, the guaranteed number of times of rewrite operation of the data area DAT becomes larger than that of the program area PGM.

A rewrite control of memory information to flash memories 11 and 12 is carried out when, for instance, the CPU 2 executes a rewrite control program. The rewrite control program is stored in for instance the flash memory 11. The CPU 2 executes a rewrite control program internally transferred from the flash memory 11 to the RAM 3. A program that the CPU 2 executes gives an instruction of rewrite operation of memory information. Alternatively, a rewrite command given from a rewrite device such as an external EPROM writer instructs. The CPU 2, when a rewrite command is externally input, deciphers this, executes the rewrite control program in accordance with the deciphered result, and thereby memory information that the flash memories 11 and 12 have is subjected to rewrite control operation. In essence, in a state where the data processor 1 is mounted on a system, the CPU 2 executes erase and rewrite control operations to the flash memories 11 and 12. In a device test or a producing step, an external writer (not shown in the drawing) instructs erase and write operations of the flash memories 11 and 12 through the input/output port 9. After a power supply is turned on, during a low level interval of a reset signal, the inside of the data processor 11 is initialized. When a reset state is released owing to a high level of the reset signal, the CPU 2 starts executing a program in a program area designated by a vector of address No 0 or the like.

Figure 4:
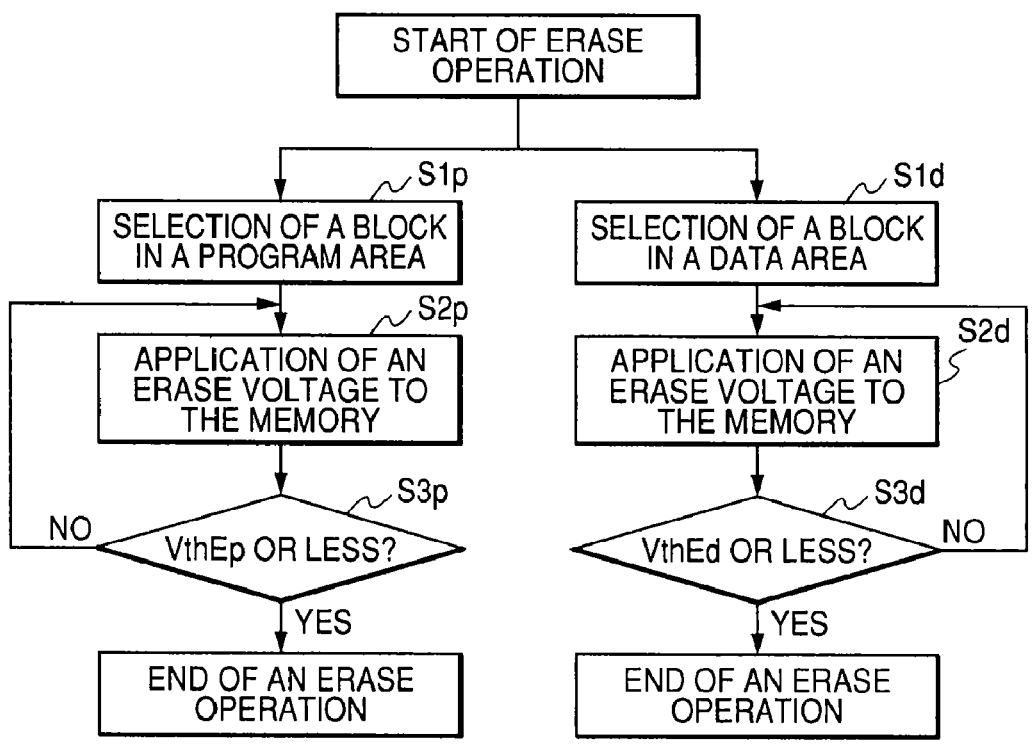
FIG. 4 is a flow chart showing an erase procedure to a flash memory when a nonvolatile memory area is segmented into a program area PGM and a data area DA.

In FIG. 4, an erase flow of a flash memory when a memory area is segmented into a program area PGM and a data area DAT is shown. When an erase operation is instructed to start, the CPU 2 determines an address to be erased. The program area PGM and the data area DAT are different in the memory space; accordingly, depending on the address to be erased, which area thereof should be erased (or write) can be determined. When the flash memory 11 is erased, a block to be erased of the program area is selected (S1*p*), and an erase voltage is applied on the selected block to be erased for a predetermined time (S2*p*). Subsequently, an erase verify operation is carried out to a nonvolatile memory cell that is an object to be erased to determine whether the threshold voltage thereof has become an erase determination level VthEp or less or not (S3*p*). When the threshold voltage is not the erase determination level VthEp or less, the erase voltage is further applied (S3*p*), steps S2*p* and S3*p* are repeated until the erase determination level VthEp or less is attained, and, when the erase determination level VthEp or less is attained, the erase operation is stopped. In the case of an erase operation to the flash memory 12, a block to be erased in the data area is selected (S1*d*) and an erase voltage is applied to the selected block to be erased for a predetermined time (S2*d*). Subsequently, an erase verify operation is carried out to a nonvolatile memory cell to be erased to determine whether the threshold voltage has become an erase determination level VthEd or less or not (S3*d*). When the threshold voltage is not the erase determination level VthEd or less, the erase voltage is further applied (S2*d*), steps S2*d* and S3*d* are repeated until the erase determination level VthEd or less is attained, and, when the erase determination level VthEd or less is attained, the erase operation is stopped. When the erase determination levels VthEp and VthEd are varied for the respective areas, threshold voltage distributions different in the program area PGM and the data area DAT can be generated. At that time, an erase voltage applied and a pulse width that specifies an erase voltage application time are parameters affecting on the characteristics deterioration; accordingly, the optimum values of the both areas can be uniquely set to control the threshold voltage.

FIG. 5 shows a write flow to a flash memory. Here, a case where write determination levels for a program area PGM and a data area DAT are set same is shown. When a write operation is instructed to start, the CPU 2 internally transfers write data to a flash memory to be written (S11) to allow selecting a word to be written in accordance with an address (S12), followed by applying a write voltage to a memory cell to be written (S13). Subsequently, a write verify operation is carried out to a nonvolatile memory cell to be written to determine whether the threshold voltage has become a write determination level VthEP or more or not (S14). When the threshold voltage is not the write determination level VthP or more, the write voltage is further applied (S13), steps S13 and S14 are repeated until the write determination level VthP or more is attained, and, when the write determination level VthP or more is attained, the write operation is stopped. Though not particularly shown in the drawing, as to a write verify determination level, a write voltage and a pulse width that specifies the write voltage application time as well, optimum values may be uniquely set in the program area PGM and the data area DAT to control.

In FIG. 6, a specification of a flash memory 11, 12 when a memory area is segmented into a program area PGM and a data area DAT is shown. In the case of an area being segmented into a program area PGM and a data area DAT, when the area is given features based on the specification, usability of users can be improved. The guaranteed number of times of rewrite operation and the read speed have been already described. Other than the above, when a unit of collective erase operation and a unit of rewrite operation are made smaller for a data area DAT larger in the guaranteed number of times of rewrite operation, the usability can be improved. Specific numerical values of the guaranteed number of times of rewrite operation and the read speed shown in the drawing are only examples.

Figure 8:
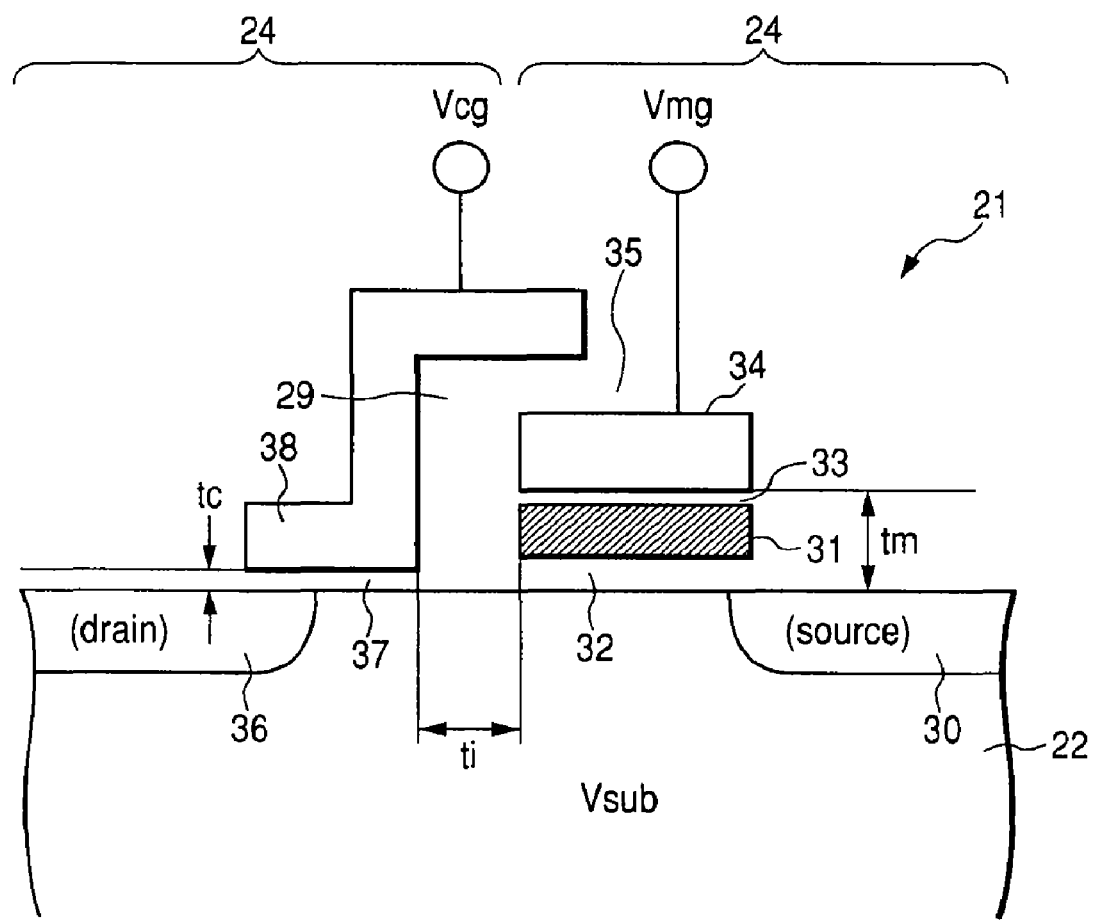
FIG. 8 is a sectional view exemplifying a device structure of a nonvolatile memory cell of a flash memory.

In FIG. 8, a device structure of a nonvolatile memory cell of a flash memory 11 or 12 is exemplified. A nonvolatile memory cell 21 is formed with, in a P-type well area 22 disposed on a silicon substrate, a first MOS type first transistor 23 for storing information and a second MOS type transistor 24 (select MOS transistor) that selects the first transistor 23. The first transistor 23 includes a N-type diffusion layer (N-type impurity area) 30 that becomes a source line electrode connected to a source line, a charge storage area (for instance, silicon nitride film) 31, insulating films (for instance, silicon oxide film) 32 and 33 disposed on front and back surfaces of the charge storage area 31, a memory gate electrode (for instance, N-type polysilicon layer) 34 for applying a high voltage at the time of write and erase operation and an oxide film (for instance, silicon oxide film) 35 for use in protection of the memory gate electrode. The second transistor 24 includes a N-type diffusion layer (N-type impurity area) 36 that becomes a bit line electrode connected to a bit line, a gate insulating film (for instance, silicon oxide film) 37, a control gate electrode (for instance, N-type polysilicon layer) 38 and an insulating film (for instance, silicon oxide film) 29 that isolates the control gate electrode 38 and the memory gate electrode 34.

When a sum total of film thicknesses of the charge storage area 31 of the first transistor 23 and the insulating films 32 and 33 disposed on front and back surfaces thereof (called memory gate insulating films 31, 32 and 33 in block) is expressed with tm, a film thickness of the gate insulating film 37 of the control gate electrode 38 is expressed with tc and a film thickness of an insulating film between the control gate electrode 38 and the charge storage area 31 is expressed with ti, a relationship of tc<tm≦ti is realized. From the dimension differences between the gate insulating film 37 and the memory gate insulating films 31, 32 and 33, a gate withstand voltage of the second transistor 24 is set lower than the gate withstand voltage of the first transistor 23.

The word "drain" written in a portion of a diffusion layer 36 means that the diffusion layer 36 functions as a drain electrode of the transistor in data read operation, and the word "source" written in a portion of a diffusion layer 30 means that the diffusion layer 30 functions as a source electrode of the transistor in a data read operation. In an erase/write operation, in some cases, the functions of the drain and source electrodes may be interchanged irrespective of the indication of drain and source.

When hot electrons are injected in the charge storage area 31, a source side of a channel of a memory transistor to which a high voltage is supplied from a drain side and a drain side of a channel of a select transistor do not enter a conductive state of electrically low resistance. This is because the source side and the drain side do not have a common low resistance area such as a diffusion area. As a result, at this time, a high voltage on a memory transistor side is not applied to the select transistor. Accordingly, even when a gate insulating film of the select transistor is formed thinner than a gate insulating film of the memory transistor, at the time of a rewrite operation, a gate oxide film of the select transistor is not destroyed. This guarantees that a thin gate oxide film makes the conductance of the select transistor larger to expedite the read speed.

In FIG. 9, features to the nonvolatile memory cell of FIG. 8 are represented. In FIG. 9, a connection state of the nonvolatile memory cell 21 in the hierarchal bit line structure is exemplified. The diffusion layer 36 is connected to a sub-bit line BL (hereinafter, simply referred to as bit line BL), the diffusion layer 30 is connected to a source line SL, the memory gate electrode 34 is connected to a memory gate control line ML and the control gate electrode 38 is connected to a control gate control line CL. The sub-bit line BL is connected through an N-channel type switch MOS transistor (ZMOS) 39 to a main-bit line (also described as global bit line) GL. Although not shown particularly in the drawing, a plurality of nonvolatile memory cells 21 is connected to the sub-bit line BL and a plurality of the bit lines BL are connected to one main-bit line GL through the ZMOSs 39 respectively.

In FIG. 9, a first driver (word driver) 41 for driving the control gate control line CL, a second driver 42 for driving the memory gate control line ML, a third driver (Z driver) 43 for switch-driving the ZMOS 39, and a fourth driver 44 for driving the source line SL are representatively shown. Each of the drivers 42 and 44 is constituted of a high voltage MOS driver using a MOS transistor whose gate withstand voltage is high. Each of the drivers 41 and 43 is constituted of a driver using a MOS transistor whose gate withstand voltage is relatively low.

In a writing operation where a relatively high threshold voltage is set in the first transistor 23 of the nonvolatile memory cell 1, for instance, with a memory gate voltage Vmg and a source line voltage Vs set to high voltage, a control gate voltage Vcg set to 1.8V, a write select bit line set to 0V (ground potential of the circuit), and a write non-select bit line set to 1.8V, the second transistor 24 of the write select bit line is turned on to pass current from the diffusion layer 30 to the diffusion layer 36. Hot electrons generated in the vicinity of the charge storage area 31 on the control gate electrode 38 side by the current may be held in the charge storage area 31.

In the case of setting the write current at a constant current to write, the write select bit line potential is not limited to the ground potential. For example, it is sufficient to apply substantially 0.5V to pass a channel current. In the write operation, for the N-channel type memory cell, the diffusion layer 30 functions as a drain and the diffusion layer 36 functions as a source. The writing form is injection of hot electrons to the source side. In an erase operation where a relatively low threshold voltage is set to the first transistor 23, for example, a high voltage is applied to the memory gate voltage Vmg, the second transistor 24 is turned on to set the diffusion layers 36 and 30 to the ground potential of the circuit, and the electrons held in the charge storage area 31 are discharged to the memory gate electrode 34. At that time, with the second transistor 24 set in an off state or with the second transistor 24 set in an off-state and the source line set in a floating state as well, the erase operation can be performed.

As obviously understood from the write/erase operations to the first transistor 23, the operations can be realized without applying a high voltage to the control gate control line CL and the bit line BL. It assures that the gate withstand voltage of the second transistor 24 may be relatively low. It neither requires for the ZMOS 39 to have a high voltage.

Although not particularly restricted, the first transistor 24 in an erase state of which the threshold voltage is set low is one of a depletion type, and the first transistor 24 in a write state of which the threshold voltage is set high is one of an enhancement type.

In the read operation to the nonvolatile memory cell 21 in FIG. 9, it is sufficient to set the source line voltage Vs and the memory gate voltage Vmg at 0V and the control gate voltage Vcg of a memory cell to be selected for reading at a select level of 1.8V. When the second transistor 24 is turned on, depending on whether a current flows or not in accordance with a threshold voltage state of the first transistor 23, stored information is read to the bit line BL. Since the second transistor 24 has a gate oxide film thickness thinner than that of the first transistor 23 and a smaller gate withstand voltage, the conductance of the whole nonvolatile memory cell 21 can be made relatively larger as compared with that in the case where both of a MOS transistor for storage and a MOS transistor for selection are formed with high voltage. Thus, the data read speed can be expedited.

Figure 10:
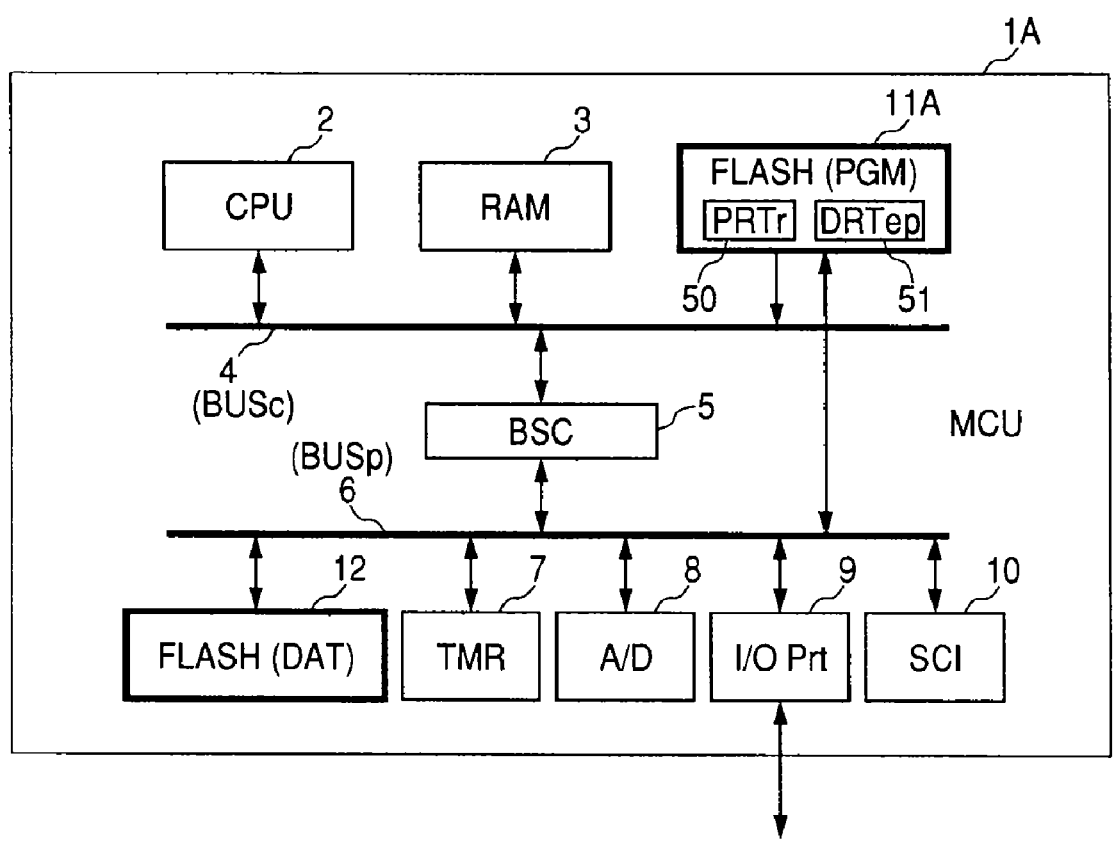
FIG. 10 is a block diagram showing a second example of a data processor.

In FIG. 10, a second example of a data processor is shown. A data processor 1A of FIG. 10 is different from that shown in FIG. 1 in that a flash memory 11A that is used in a program area is rewritten from a peripheral bus. At that time, the flash memory 11A separately includes a first access port (PRTr) 50 that is used in a read access to the CPU bus 4 and a second access port (PRTep) 51 that is used in an access for rewriting memory information from the peripheral bus 6, the CPU 2 carrying out an access control operation for rewriting memory information to the flash memory 11A through a bus controller 5. An address space to the flash memory 11A seen from the first access port 50 and an address space to the flash memory 11A seen from the second access port 51 are differentiated from each other. For instance, the CPU 2 executes a rewrite control program to apply a rewrite control operation to the flash memory 11A. The flash memory 11A for instance includes the rewrite control program. The CPU 2 executes a rewrite control program internally transferred from the flash memory 11A to a RAM 3. A program that the CPU executes instructs a rewrite operation of the memory information. Alternatively, a rewrite command given through an I/O port 9 from a rewrite device such as an external EPROM writer instructs. The CPU 2, when a rewrite command is externally input, deciphers this. According to a deciphered result, a rewrite control program that the flash memory 11A has is executed, and thereby memory information that the flash memory 11A has is subjected to a rewrite control operation. The rewrite command includes a rewrite control code, an address to be rewritten, rewrite data and the like.

Figure 11:
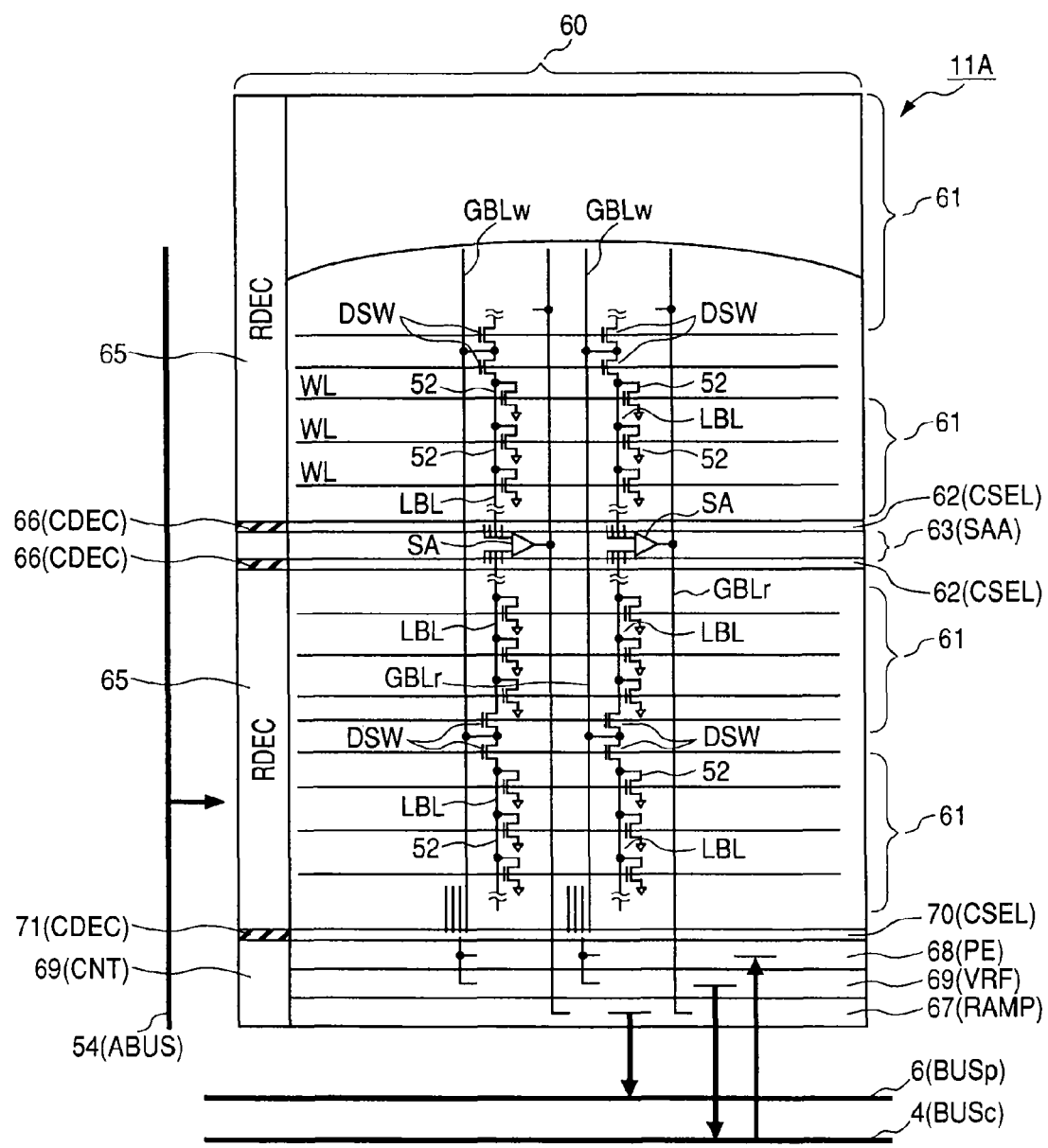
FIG. 11 is a circuit diagram exemplifying a configuration of a flash memory.

In FIG. 11, an example of a configuration of the flash memory 11A is exemplified. The flash memory 11A has a memory mat 60 where a number of electrically erasable and writable nonvolatile memory cells 52 are disposed in matrix. Here, representatively, one memory mat is shown. The nonvolatile memory cell 52, though not particularly restricted, is formed into a stacked gate structure that includes a source (source line connection), a drain (bit line connection), a channel and a floating gate and a control gate (word line connection) that are stacked on the channel insulated from each other. Alternatively, the nonvolatile memory cell 52 may be formed into a split-gate structure that includes the source (connected to a source line) described in FIGS. 8 and 9, a drain (connected to a bit line), a channel and a select gate (connected to a word line) and a memory gate (connected to a memory gate control line) that are formed adjacently and insulated from each other on the channel.

The memory mat 60 has a plurality of memory arrays 61. For every memory array 61, a plurality of local bit lines LBL is disposed, the local bit line LBL being selected by a column select circuit (CSEL) 62 and a sense amplifier array (SAA) 63 receiving an output of the column select circuit 62. In a sense amplifier array 63 of the drawing, representatively, two sense amplifiers SA are shown. An output of the sense amplifier array 63 is connected to a read global bit line GBLr common to the respective memory arrays. In essence, the bit lines are formed into a hierarchal bit line structure and the sense amplifier amplifies according to a hierarchal sense method. A pair of memory arrays 61 up and down in the drawing has a sense amplifier array 63 in common. Mutually, when a local bit line of one memory array is set a sense side, a local bit line of the other memory array is set a reference side. A write system has a write global bit line GBLw isolated from a read system, the write global bit line GBLw is communized to the respective memory arrays 61. A local bit line LBL corresponding to a write global bit line GBLw can be selectively connected or isolated through a detaching switch DSW. During a read operation, the detaching switch DSW detaches the write global bit line GBLw from the local bit line LBL at least in a memory array to be read. Though not particularly restricted, the read global bit line GBLr is set to 32 lines and the read global bit line GBLw is set to 1024 lines. The write global bit line GBLw is utilized as well in a verify read operation.

A word line WL of a nonvolatile memory cell 52 is selectively driven in accordance with a decoded result of an address signal due to a row decoder (RDEC) 65. A drive level is determined depending on an erase, write or read operation to a flash memory. A column select circuit 62 selects a local bit line LBL in accordance with a decoded result of an address signal by the column decoder (CDEC) 66. The detach switch DSW and the sense amplifier SA are controlled by the row decoder 65 in response to a read, erase or write operation to a memory array. An address signal is supplied from an address bus (ABUS) 54. Only one kind of address bus 54 is shown in the drawing. However, an address space to the flash memory 11A seen from the first access port 50 and an address space to the flash memory 11A seen from the second access port 51 are differentiated; accordingly, in actuality, an address bus on a CPU 4 side and an address bus on a peripheral bus 6 side are separately connected.

The read global bit line GBLr is connected through a high-speed read sense amplifier circuit (RAMP) 67 to a data bus of the CPU 4. The write global bit line GBLw is connected to a write circuit (PE) 68 and a verify read circuit (VRF) 69. The write circuit 68 and verify read circuit 69 are connected through a column select circuit 70 to a data bus of the peripheral bus 6. The column select circuit 70 has a data latch of 1024 bits and, in a write operation, selectively connects the data latch of 1024 bits at a unit of 32 bits to a data bus of the peripheral bus 6. The selection is carried out due to a select signal from a column decoder (CDEC) 71. In a write operation, the column select circuit 70 sequentially and at a unit of 32 bits loads write control data that are sequentially outputted from the CPU 2 for instance at a unit of 32 bits and supplied through a bus controller to the peripheral bus 6 in a data latch. The write circuit 68 applies a write voltage to a corresponding write bit line GBLw in accordance with a logical value of each of write control data of 1024 bits latched in the data latch through the column select circuit 70. In a verify read operation, 1024 bits of data read in the respective write bit lines GBLw are latched in parallel in the data latch, and the latched data are sequentially selected at a unit of 32 bits by the column select circuit 70 and outputted to the data bus of the peripheral bus 6 after amplification at the verify read circuit 69. The data read in the peripheral bus 6 in the verify read operation are verify determined at the CPU 2. In the verify determination in the write operation, at a unit of bit, whether a write logical value is obtained or not is determined, and the determination result is supplied for every corresponding bit from the CPU 2 to the write circuit 68 as new write control data. In the verify determination in an erase operation, whether all bits have become logical values in erase state or not is determined. In the control circuit (CNT) 69, through the CPU 4 from the CPU 2, or through the peripheral bus 6, memory control information is set and in accordance with this a control sequence corresponding to read, erase and write operations and a switching control of an operation power supply are carried out.

In the nonvolatile memory cell 52 having a stacked gate structure, between a source area connected to a source line and a drain area connected to a local bit line LBL, a channel area is formed, on the channel area a floating gate electrode is formed through a gate insulating film, and thereon through an oxide film a gate control electrode is formed. The floating gate electrode is constituted of a polysilicon layer. The control gate electrode is constituted of a polysilicon wiring and becomes a part of a word line WL.

When the write operation is carried out by injection of hot carriers, operation voltages are as follows. For instance, in the write operation, with a word line voltage set at 10V, a bit line voltage set at 5V, a source line voltage set at 0V and a well voltage set at 0V, hot carriers are injected from a drain area to a floating gate. In the erase operation, with a word line voltage set at −10V, a well voltage set at 10V and a bit line and a source line set at high impedance, electrons are extracted from the floating gate to a well area. In the read operation, with a word line voltage set at a power source voltage, a bit line voltage set at a power source voltage, a source line voltage set at 0V and a well voltage set at 0V, the operation is carried out. In the erase and write operations, high voltages are necessarily applied to a word line and a well area.

As described in FIG. 10, when an access port is segmented into one that is used for reading memory information and the other that is used for rewriting memory information and the memory information is rewritten from the peripheral bus 6, a first access port (PRTr) 50 that is a read port can be readily optimized for expediting a read operation. For instance, in the read port, an input buffer that receives rewrite data becomes unnecessary. Since an input buffer accompanies input capacitance that becomes a load for a data signal line, such input capacitance is desirably as small as possible for a high-speed bus. This is because the write data are in some cases inputted from an I/O port, furthermore, a verify read operation, even when the peripheral bus 6 that is a low-speed bus is used, does not affect on the rewrite characteristics of memory information.

Figure 12:
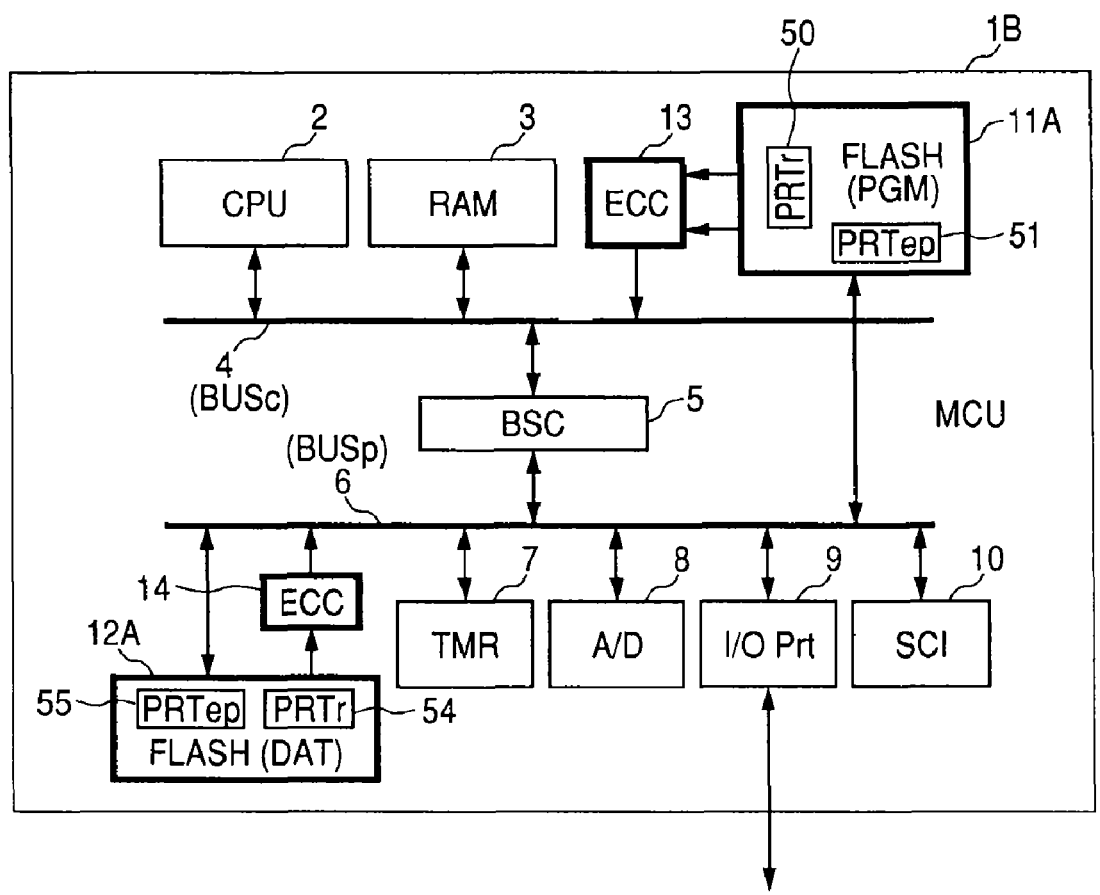
FIG. 12 is a block diagram showing a third example of a data processor.

FIG. 12 shows a third example of a data processor. A data processor 1B shown in FIG. 12 is different from that of FIG. 1 in that to data read from flash memories 11A and 12A error detection and correction circuits (ECC circuit) 13 and 14 that detect and correct an error are disposed. The ECC circuit 13 is disposed between a first access port (PRTr) 50 of the flash memory 11A and the data bus of the CPU bus 4. The flash memory 12A for storing data as well separately has a first access port (PRTr) 54 that is used in a read access operation to the peripheral bus 6 and a second access port (PRTep) 55 that is used in a rewrite access operation of memory information from the peripheral bus 6 and an ECC circuit 14 is disposed between the first access port (PRTr) 54 of the flash memory 12A and the data bus of the peripheral bus 6.

In a verify operation, from the nature thereof, it is inconvenient to apply an error correction operation to read data. When the same access port is commonly used in read and rewrite operations of memory information, in the rewrite operation a signal path that detours the ECC circuit 13 is necessarily added, and such an additional path constitutes a undesirable load for a read operation of memory information. At that time, when the access ports 50 and 51, respectively, are divided into a read port and a rewrite port and memory information is rewritten from the peripheral bus 6, even when the ECC circuit 13 is disposed between the first access port 50 and the CPU bus 4, a higher speed in the read operation can be readily guaranteed.

Though not particularly shown in the drawing, when an ECC circuit 13 is incorporated to apply error correction, in the DAT area, by making use of a feature of reading at a low-speed, without disposing an ECC circuit 13 as a hardware on the flash memory 12A side, in place thereof, a correction code of the ECC and storage data are read together and the CPU 2 may execute a program for use in ECC circuit to correct errors with a software. Furthermore, when a plurality of pieces of flash memory 11A that constitutes a program area is on-chipped, through a common ECC circuit, lead data may be outputted to the CPU bus 4.

Figure 13:
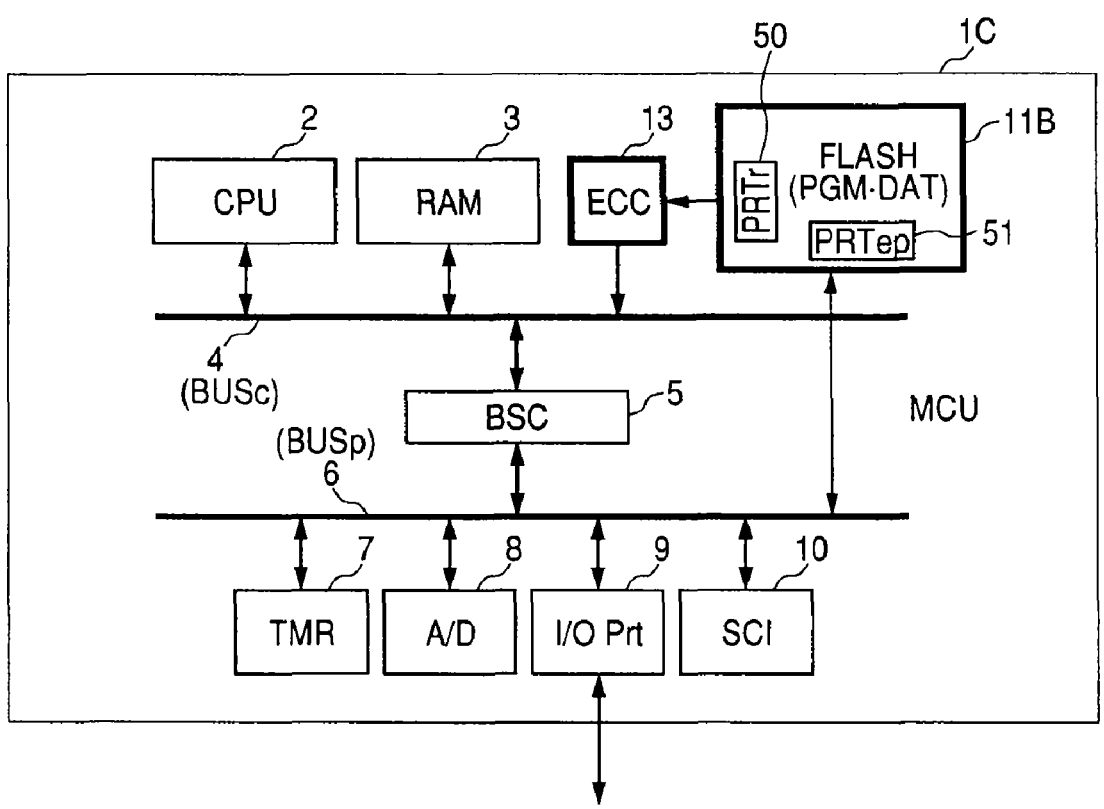
FIG. 13 is a block diagram showing a fourth example of a data processor.

In FIG. 13, a fourth example of a data processor is shown. A data processor 1C shown in the drawing is different from that shown in FIG. 2 in that in a memory array of one flash memory 11B a data area (DAT) and a program area (PGM) are disposed. A flash memory 12 or 12A exclusive for a data area is not disposed. A first access port 50 is connected to a CPU bus 4 and between the first access port 50 and a data bus of the CPU bus 4 an ECC circuit 13 is interposed. Though not particularly shown in the drawing, when a data area (DAT) and a program area (PGM) are constituted in a memory array of one flash memory 11B, a configuration where an ECC circuit 13 is not disposed, or a software ECC due to a program is realized with the CPU 2 or the flash memory 11B is connected only to the CPU bus 4 may be adopted.

Figure 14:
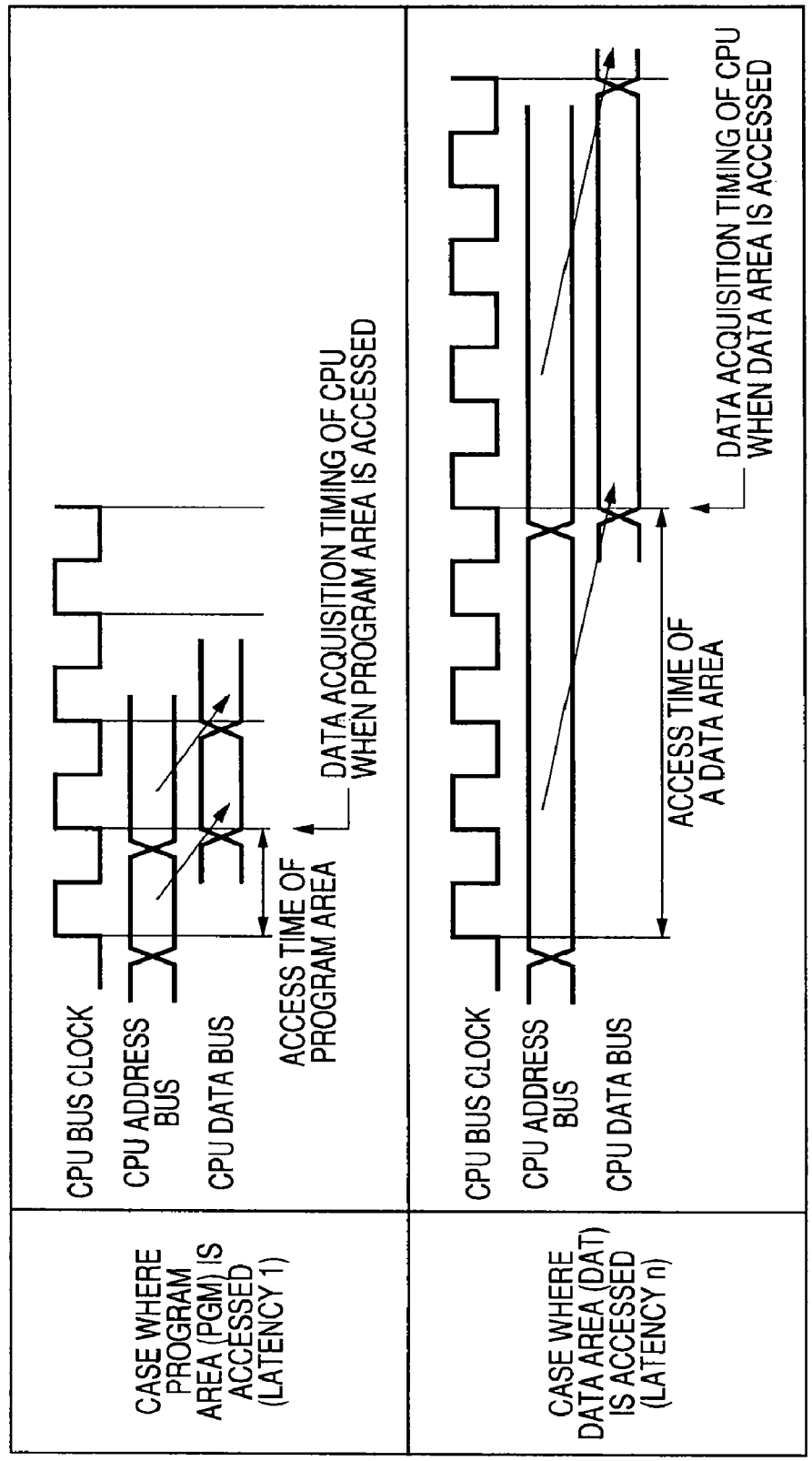
FIG. 14 is a timing chart showing an example where, when a program area (PGM) and a data area (DAT) are made same in a memory array configuration, the program area (PGM) and the data area (DAT) are accessed at different bus cycles.

When a rewrite operation is applied in accordance with a procedure shown in FIG. 4 from the second access port 51 to the program area (PGM) and the data area (DAT) constituted in the same flash memory 11B, in the program area (PGM) an erase threshold voltage distribution of a relatively low voltage level can be obtained and in the data area (DAT) an erase threshold voltage distribution of a relatively high voltage level can be obtained. For instance, when the flash memory 11B has a configuration described in FIG. 11, since configurations of memory arrays of the program area (PGM) and the data area (DAT) are identical, a read speed of memory information from a memory cell of the data area (DAT) is relatively slow and a read speed of memory information from a memory cell of the program area (PGM) is relatively fast. To the difference, for instance, the CPU 2, as shown in FIG. 14, may make an access to the program area (PGM) and the data area (DAT) at different bus cycles. That is, when the data area (DAT) is read, a latency is set large. Referring to FIG. 14, when the program area (PGM) is accessed, the latency is set at 1 and, when the data area (DAT) is accessed, the latency is set at n=4.

Figure 15:
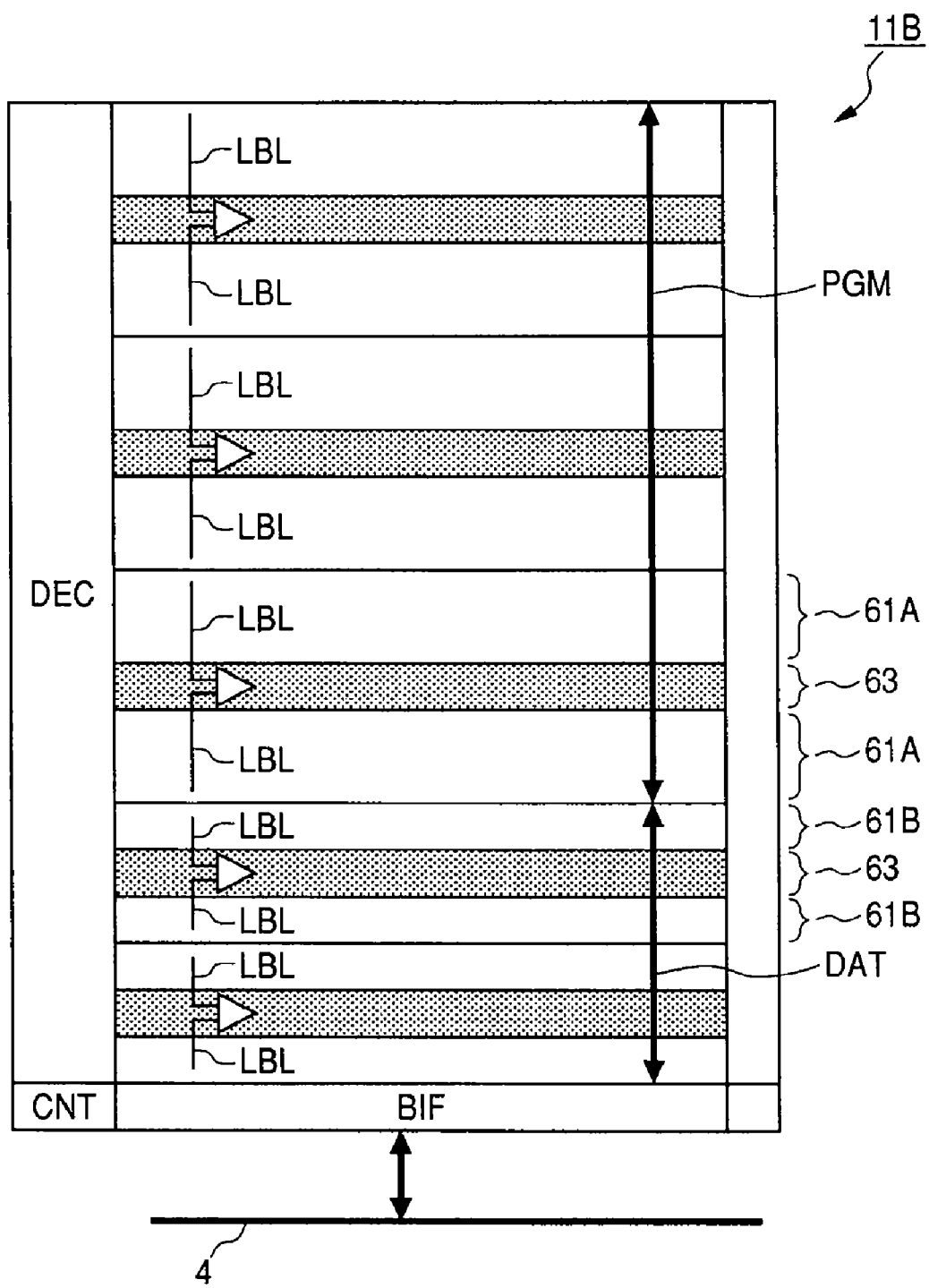
FIG. 15 is a circuit diagram exemplifying a memory array configuration where read speeds of the data area (DAT) and the program area (PGM) are made same.

In FIG. 15, in the flash memory 11B, an example of a configuration of a memory array where a read speed is set same in the data area (DAT) and the program area (PGM) is exemplified. When a data area (DAT) small in a read memory current is disposed in a memory array same as that of the program area (PGM), the number of bits of the memory cell connecting to a sense amplifier SA in a hierarchal sense amplifier structure, in other words, a length of a local bit line LBL is made sufficiently small compared to that of the program area (PGM). In essence, in comparison with a memory array 61A of the program area (PGM), a memory array 61B of the data area (DAT) is made smaller. Thereby, the data area (DAT) where a memory current is small as well, without lowering the read speed, can be read. In FIG. 15, configurations of a writing system and the like are omitted from showing; however, these are same as in FIG. 11. In FIG. 14, a term "DEC" generically calls a column decoder and a row decoder, a term "BIF" means a bus interface and a term "CNT" means a control circuit.

Alternatively, when a read speed of the program area (PGM) is more expedited and a read speed of the data area (DAT) is relatively slowed, a length of a local bit line LBL of a memory array 61A of the program area (PGM) may be shortened than that of a local bit line LBL of the data area (DAT). Thereby, a load of the local bit line LBL of the program area (PGM) can be made smaller and thereby a read speed can be more expedited.

Figure 16:
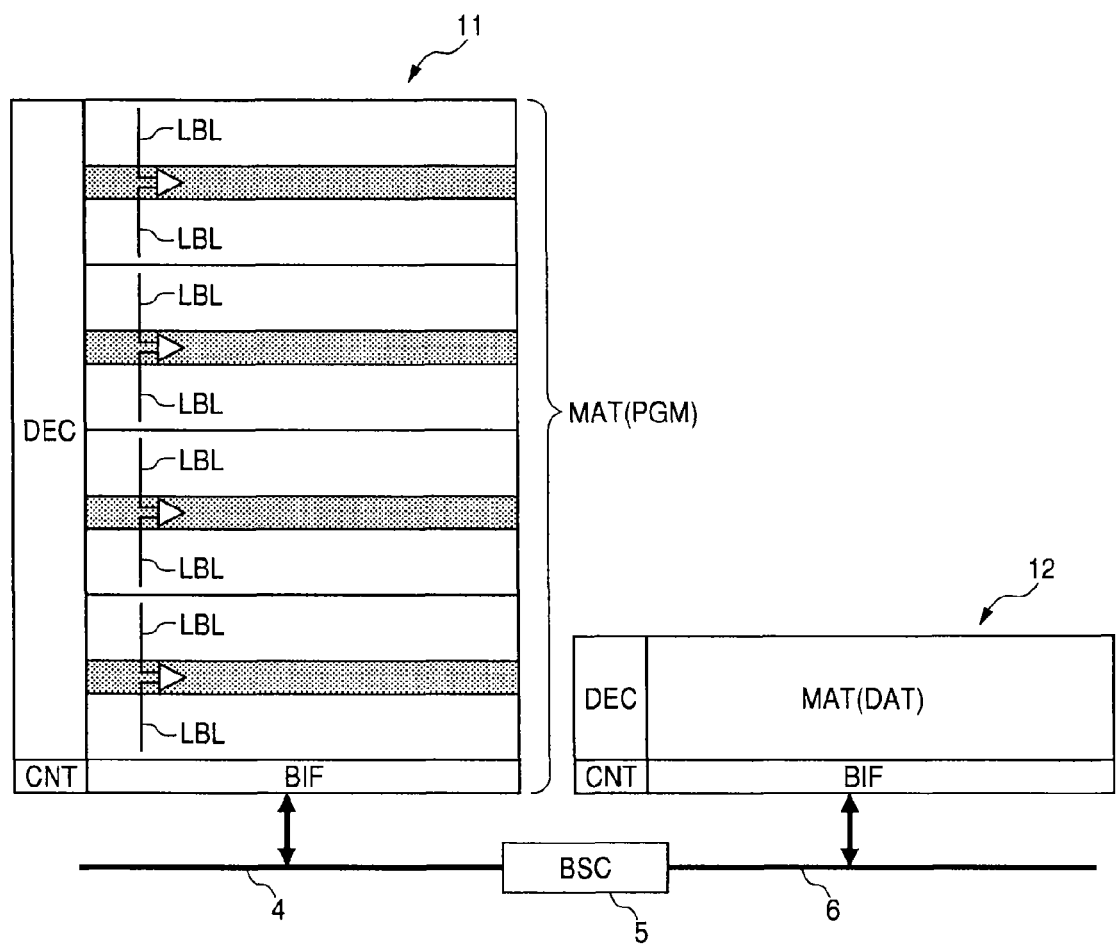
FIG. 16 is a circuit diagram showing a mode where two flash memories are separately connected to a CPU bus and a peripheral bus.

In FIG. 16, a mode where two flash memories are separately connected to a CPU bus and a peripheral bus is shown. In a flash memory 11 connected to a CPU bus 4, a hierarchal sense amplifier structure may be adopted to expedite a read speed. Since a flash memory 12 that is connected to the peripheral bus 6 is not intended to expedite, the hierarchal sense amplifier structure is less advantageously adopted. A reference sign "MAT (PGM)" shows a memory mat that is rendered a program area and a reference sign "MAT (DAT)" shows a memory mat that is rendered a data area.

Owing to a data processor described above, advantages below can be obtained.

(1) When a memory area is divided into two areas of a program area (PGM) and a data area (DAT) and erase and write conditions such as an applied voltage and an applied time that determine the performance or the deterioration of the flash memory are varied, the performances necessary for both can be obtained. Nonvolatile memories different in the applications such as one that realizes a high-speed read operation and one in which the number of times of rewrite operation is particularly improved can be realized on one chip without varying producing conditions.

(2) When an access port of a flash memory is segmented into one for use in a read operation of memory information and one for use in a rewrite operation, a port for use in a read operation can be readily optimized for expediting a read operation. For instance, in a port 50 for use in a read operation, an input buffer that receives rewrite data is unnecessary. The input buffer accompanies input capacitance that becomes a load to a data line for use in a data input operation. Furthermore, in the case where an ECC circuit 13 capable of detecting and correcting an error to data read from the first access port 50 is disposed between the first access port 50 and the CPU bus 4 as well, there is no need of considering a verify operation in a rewrite operation. In the verify operation, from the nature thereof, data can be inconveniently corrected. When one access port is used for read and rewrite operations of memory information, in the rewrite operation, a signal path that detours the ECC circuit 13 is necessarily added. Such an additional path constitutes an undesirable load to the read operation of memory information.

(3) When an address space to the flash memory 11A seen from the first access port 50 and an address space to the flash memory 11A seen from the second access port 51 are differentiated, the CPU 2 connected to the CPU bus 4 can conveniently control a rewrite operation of memory information from the second access port 51 through the peripheral bus 6.

(4) When a data area DAT and a program area PGM are constituted in one flash memory 11B having a hierarchal sense structure, when a bit line load of the former one is made smaller than that of the latter one, the guaranteed number of times of rewrite operation can be increased to the program area PGM and read access cycles to both the data area DAT and the program area PGM can be equalized.

In the above, the invention achieved by the inventors is specifically described with reference to embodiments. However, the invention is not restricted thereto. It goes without saying that, within a range that does not deviate from a gist of the invention, a variety of modifications can be applied.

For instance, in each of a memory cell of a program area and a memory cell of a data area, when the maximum variation width of the threshold voltage is made larger, an erase threshold voltage distribution of memory cells of the program area is made lower than an erase threshold voltage distribution of memory cells in the data area. However, a write threshold voltage distribution of memory cells of the program area may be made higher than a write threshold voltage distribution of memory cells in the data area. In the former case, in each of the program and data areas, read determination levels such as a read word line select level may be the same. In the case of the latter, a read determination level may be higher in the program area than the data area.

A bus configuration of the data processor is not restricted to a two-bus configuration. A three-bus configuration or a one-bus configuration can be adopted. It goes without saying that, on the data processor, a different circuit module other than the above can be on-chipped. An electrically rewritable nonvolatile memory, without restricting to the flash memory, may be an EEPROM.

Furthermore, in FIG. 2 and others, it is described that a voltage applied to a word line is varied to set a threshold voltage of a memory cell. However, in place of varying the word line voltage, a current amount passing a sense amplifier may be measured to determine an erase state of the memory cell. In the case of such a nonvolatile memory, even when a state of a threshold voltage of a memory cell is a main factor for determining a value stored in the memory cell, since load capacitance or resistance of wirings connected to the memory cell affect, a threshold voltage distribution of the memory cell is considered different from one shown in FIG. 2. In the case of such a nonvolatile memory, a memory Vth of a horizontal axis of FIG. 2 may be interchanged with a memory current amount.

INDUSTRIAL APPLICABILITY

The present invention can be widely applied to semiconductor integrated circuits such as microcomputers where a rewritable nonvolatile memory such as a flash memory is on-chipped and system LSIs and multi-tip modules that mount such a semiconductor integrated circuit and a separate semiconductor integrated circuit on a package substrate.

The invention claimed is:

1. A semiconductor integrated circuit comprising:
a processing unit;
a volatile memory;
a first bus which is coupled to the processing unit and the volatile memory;
a second bus which is different from the first bus;
a bus controller which is coupled between the first bus and the second bus;
a first electrically rewritable nonvolatile memory which is coupled to the first bus and which stores information based on difference of threshold voltages; and
a second electrically rewritable nonvolatile memory which is coupled to the second bus and which stores information based on difference of threshold voltages,
wherein the first electrically rewritable nonvolatile memory is used to store a program that the processing unit executes and the second electrically rewritable nonvolatile memory is used to store data used when the processing unit executes the program,
wherein a maximum variation width of a memory threshold voltage of the first electrically rewritable nonvolatile memory is larger than a maximum variation width of a memory threshold voltage of the second electrically rewritable nonvolatile memory between an erase determination level and a write determination level, and
wherein the first electrically rewritable nonvolatile memory and the second electrically rewritable nonvolatile memory each include a number of nonvolatile memory cells, each of the nonvolatile memory cells having:
a memory transistor of which threshold voltage is differentiated based on a charge retention state of a charge storage area and a select transistor which selectively connects the memory transistor to a bit line,
wherein a gate insulating film of the select transistor is formed thinner than a gate insulating film of the memory transistor, and
wherein hot electrons formed based on a potential difference between a channel formed in a semiconductor area immediately below a gate electrode of the select transistor and a channel formed in a semiconductor area immediately below a charge storage area of the memory transistor are injected in the charge storage area to set a threshold voltage higher to reduce electrons held in the charge storage area to initialize a threshold voltage in a lower direction.

2. The semiconductor integrated circuit according to claim 1,
wherein the first electrically rewritable nonvolatile memory has a first access port that is used in a read access to the first bus, and a second access port that is used in a rewrite access of memory information from the second bus, and
wherein the processing unit executes an access control to rewrite memory information to the first electrically rewritable nonvolatile memory.

3. The semiconductor integrated circuit according to claim 2, wherein an address space to the first electrically rewritable nonvolatile memory seen from the first access port and an address space to the first electrically rewritable nonvolatile memory seen from the second access port are different.

4. The semiconductor integrated circuit according to claim 3, wherein the processing unit, when an external interface circuit is coupled to the second bus and a rewrite command is externally inputted in the external interface circuit, deciphers the rewrite command and executes a rewrite control program that the first electrically rewritable nonvolatile memory holds in accordance with a deciphered result to control a rewrite operation of memory information that the first electrically rewritable nonvolatile memory holds.

5. The semiconductor integrated circuit according to claim 4, further comprising:
an ECC circuit disposed between the first access port and the first bus, the ECC circuit detecting and correcting an error to data read from the first access port.

6. A data processing device on a semiconductor substrate, the data processing device comprising:
a first bus;
a second bus;
a processing unit coupled to the first bus;
a volatile memory coupled to the first bus;
an input/output port coupled to the second bus;
a first ECC circuit coupled to the first bus;
a first electrically rewritable nonvolatile memory having a read port coupled to the first ECC circuit and a rewrite control program to be executed by the processing unit and a write port coupled to the second bus;
a bus controller coupled between the first bus and the second bus;
a second ECC circuit coupled to the second bus; and
a second electrically rewritable nonvolatile memory having a read port coupled to the second ECC circuit and a write port coupled to the second bus and storing data to be used by the processing unit,
wherein the processing unit executes instructions to apply a rewrite operation of the memory information after the processing unit executes the rewrite control program transferred from the first electrically rewritable memory to the volatile memory.

7. The data processing device according to claim 6, wherein the first electrically rewritable memory and the second electrically rewritable memory each include a plurality of electrically rewritable nonvolatile memory cells, each of the electrically rewritable nonvolatile memory cells including:
a first gate;
a second gate; and
a charge storage area including an insulating film, the charge storage area being between the second gate and a channel of the second gate, the channel being in the semiconductor substrate.

8. The data processing device according to claim 6,
wherein a memory threshold voltage of the second electrically rewritable nonvolatile memory is higher than a memory threshold voltage of the first electrically rewritable nonvolatile memory at an erase state, and
wherein the first electrically rewritable nonvolatile memory and the second electrically rewritable nonvolatile memory each include a number of nonvolatile memory cells, each of the nonvolatile memory cells having:
a memory transistor of which threshold voltage is differentiated based on a charge retention state of a charge storage area and a select transistor which selectively connects the memory transistor to a bit line,
wherein a gate insulating film of the select transistor is formed thinner than a gate insulating film of the memory transistor, and
wherein hot electrons formed based on a potential difference between a channel formed in a semiconductor area immediately below a gate electrode of the select transistor and a channel formed in a semiconductor area immediately below a charge storage area of the memory transistor are injected in the charge storage area to set a threshold voltage higher to reduce electrons held in the charge storage area to initialize a threshold voltage in a lower direction.

9. A data processing device on a semiconductor substrate, the data processing device comprising:
a first bus;
a second bus;
a processing unit coupled to the first bus;
a volatile memory coupled to the first bus;
an input/output port coupled to the second bus;
a first ECC circuit coupled to the first bus;
a first electrically rewritable nonvolatile memory having a read port coupled to the first ECC circuit and a rewrite control program to be executed by the processing unit and a write port coupled to the second bus;
a bus controller coupled between the first bus and the second bus;
a second ECC circuit coupled to the second bus; and
a second electrically rewritable nonvolatile memory having a read port coupled to the second ECC circuit and a write port coupled to the second bus and storing data to be used by the processing unit,
wherein a rewrite command given through the input/output port from an external device causes execution of instructions to apply a rewrite operation of the memory information after the processing unit executes the rewrite control program transferred from the first electrically rewritable memory to the volatile memory.

10. The data processing device according to claim 9, wherein the first electrically rewritable memory and the second electrically rewritable memory each include a plurality of electrically rewritable nonvolatile memory cells, each of the electrically rewritable nonvolatile memory cells including:
a first gate;
a second gate; and
a charge storage area including an insulating film, the charge storage area being between the second gate and a channel of the second gate, the channel being in the semiconductor substrate.

11. The data processing device according to claim 9,
wherein a memory threshold voltage of the second electrically rewritable nonvolatile memory is higher than a memory threshold voltage of the first electrically rewritable nonvolatile memory at an erase state, and
wherein the first electrically rewritable nonvolatile memory and the second electrically rewritable nonvolatile memory each include a number of nonvolatile memory cells, each of the nonvolatile memory cells having:
a memory transistor of which threshold voltage is differentiated based on a charge retention state of a charge storage area and a select transistor which selectively connects the memory transistor to a bit line,
wherein a gate insulating film of the select transistor is formed thinner than a gate insulating film of the memory transistor, and
wherein hot electrons formed based on a potential difference between a channel formed in a semiconductor area immediately below a gate electrode of the select transistor and a channel formed in a semiconductor area immediately below a charge storage area of the memory transistor are injected in the charge storage area to set a threshold voltage higher to reduce electrons held in the charge storage area to initialize a threshold voltage in a lower direction.

12. A data processing device on a semiconductor substrate, the data processing device comprising:
- a first bus;
- a second bus;
- a processing unit coupled to the first bus;
- a volatile memory coupled to the first bus;
- a first ECC circuit coupled to the first bus;
- a first electrically rewritable nonvolatile memory having a read port coupled to the first ECC circuit and storing a program to be executed by the processing unit and a write port coupled to the second bus;
- a bus controller coupled between the first bus and the second bus;
- a second ECC circuit coupled to the second bus;
- a second electrically rewritable nonvolatile memory having a read port coupled to the second ECC circuit and a write port coupled to the second bus and storing data to be used by the processing unit, wherein the first electrically rewritable memory and the second electrically rewritable memory each include a plurality of electrically rewritable nonvolatile memory cells, each of the electrically rewritable nonvolatile memory cells including:
- a first gate;
- a second gate; and
- a charge storage area including an insulating film, the charge storage area being between the second gate and a channel of the second gate, the channel being in the semiconductor substrate, wherein the data processing device includes:
- a first circuit coupled to the first gates of the plurality of nonvolatile memory cells;
- a second circuit coupled to the second gates of the plurality of nonvolatile memory cells, wherein a gate withstand voltage of the first circuit is lower than that of the second circuit.

* * * * *